United States Patent
Sawaya et al.

(10) Patent No.: US 11,833,782 B2
(45) Date of Patent: Dec. 5, 2023

(54) POLYMER FILM, LAMINATE, AND SUBSTRATE FOR HIGH-SPEED COMMUNICATION

(71) Applicant: FUJIFILM Corporation, Tokyo (JP)

(72) Inventors: Takeaki Sawaya, Shizuoka (JP); Akira Yamada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/953,333

(22) Filed: Sep. 27, 2022

(65) Prior Publication Data

US 2023/0104175 A1    Apr. 6, 2023

(30) Foreign Application Priority Data

Sep. 29, 2021 (JP) .................. 2021-159253

(51) Int. Cl.
*B32B 15/085*    (2006.01)
*B32B 27/32*    (2006.01)

(52) U.S. Cl.
CPC ............ *B32B 15/085* (2013.01); *B32B 27/32* (2013.01); *B32B 2305/55* (2013.01); *B32B 2307/30* (2013.01); *B32B 2307/704* (2013.01); *B32B 2307/732* (2013.01)

(58) Field of Classification Search
None
See application file for complete search history.

(56) References Cited

U.S. PATENT DOCUMENTS

| 9,538,646 B2 | 1/2017 | Onodera et al. | |
| 2014/0231123 A1* | 8/2014 | Onodera | C08J 5/18 174/255 |
| 2020/0017769 A1* | 1/2020 | Konno | B32B 27/28 |

FOREIGN PATENT DOCUMENTS

JP    6640072    2/2020

* cited by examiner

*Primary Examiner* — John Vincent Lawler
(74) *Attorney, Agent, or Firm* — JCIPRNET (57) ABSTRACT

An object of the present invention is to provide a polymer film to which a metal-containing layer is stuck to produce a laminate having an excellent peel strength. Another object of the present invention is to provide a laminate and a substrate for high-speed communication. The polymer film of an embodiment of the present invention is a polymer film including a liquid crystal polymer, in which a difference between a melting start temperature and a melting end temperature in differential scanning calorimetry in a depth region up to 10 μm of the polymer film from one surface toward the other surface of the polymer film is 5.0° C. to 50° C.

17 Claims, 1 Drawing Sheet

POLYMER FILM, LAMINATE, AND SUBSTRATE FOR HIGH-SPEED COMMUNICATION

CROSS-REFERENCE TO RELATED APPLICATIONS

The present application claims priority under 35 U.S.C. § 119 to Japanese Patent Application No. 2021-159253, filed on Sep. 29, 2021. The above applications is hereby expressly incorporated by reference, in its entirety, into the present application.

BACKGROUND OF THE INVENTION

1. Field of the Invention

The present invention relates to a polymer film, a laminate, and a substrate for high-speed communication.

2. Description of the Related Art

Higher frequencies and broadband than ever before have been used in a $5^{th}$ generation (5G) mobile communication system, which is considered to be next-generation communication technology. Therefore, as a film substrate for a circuit board for a 5G mobile communication system, those having characteristics of a low dielectric constant and a low dielectric loss tangent are in demand, and development of film substrates using various materials is in progress. One of such film substrates is a liquid crystal polymer film. Since the liquid crystal polymer (LCP) film has a lower dielectric constant and a lower dielectric loss tangent than films commonly used in $4^{th}$ generation (4G) mobile communication systems, such as a polyimide film and a glass epoxy film, it is expected as a film substrate for a high-frequency circuit board.

For example, JP6640072B describes a liquid crystal polymer film consisting of a thermoplastic polymer capable of forming an optically anisotropic molten phase, in which a change rate of relative dielectric constants before and after heating the film satisfies a specific relation; and a laminate provided with a film layer consisting of the thermoplastic liquid crystal polymer film and a metal layer.

SUMMARY OF THE INVENTION

The present inventors have conducted studies on the liquid crystal polymer film described in JP6640072B, and have thus found that there is room for improvement of a peel strength in a laminate produced by sticking the liquid crystal polymer film and a metal-containing layer to each other.

Therefore, it is an object of the present invention to provide a polymer film to which a metal-containing layer is stuck to produce a laminate having an excellent peel strength. Another object of the present invention is to provide a laminate and a substrate for high-speed communication.

The present inventors have conducted intensive studies to accomplish the objects, and have thus found that in a case where a difference between a melting start temperature and a melting end temperature is within a specific range in differential scanning calorimetry in a surface layer region of a polymer film, a laminate produced by sticking a metal-containing layer to the polymer film has an excellent peel strength, thereby completing the present invention.

That is, the present inventors have found that the objects can be accomplished by the following configurations.

[1] A polymer film comprising a liquid crystal polymer, in which a difference between a melting start temperature and a melting end temperature in differential scanning calorimetry in a depth region up to 10 μm of the polymer film from one surface toward the other surface of the polymer film is 5.0° C. to 50° C.

[2] The polymer film as described in [1], in which an area A1 of a melting peak in differential scanning calorimetry in the depth region from one surface up to 10 μm of the polymer film is smaller than an area A2 of a melting peak in differential scanning calorimetry of the entire polymer film.

[3] The polymer film as described in [2], in which the area A1 is 1.0 to 12.0 J/g and the area A2 is 3.0 J/g or more.

[4] The polymer film as described in any one of [1] to [3], in which a melting peak temperature in differential scanning calorimetry in the depth region from one surface up to 10 μm of the polymer film is 290° C. to 340° C.

[5] The polymer film as described in any one of [1] to [4], in which a thickness of the polymer film is more than 10 μm and 250 μm or less.

[6] The polymer film as described in any one of [1] to [5], in which a linear expansion coefficient in a first direction in a plane of the polymer film and a linear expansion coefficient in a second direction orthogonal to the first direction in the plane of the polymer film are both 0 to 40 ppm/° C.

[7] The polymer film as described in any one of [1] to [6], in which the liquid crystal polymer includes a repeating unit derived from 6-hydroxy-2-naphthoic acid.

[8] The polymer film as described in any one of [1] to [6], in which the liquid crystal polymer includes at least one selected from the group consisting of a repeating unit derived from 6-hydroxy-2-naphthoic acid, a repeating unit derived from an aromatic diol compound, a repeating unit derived from terephthalic acid, and a repeating unit derived from 2,6-naphthalenedicarboxylic acid.

[9] The polymer film as described in any one of [1] to [8], further comprising a polyolefin.

[10] The polymer film as described in [9], in which a content of the polyolefin is 0.1% to 40% by mass with respect to a total mass of the polymer film.

[11] The polymer film as described in [9] or [10], in which the polyolefin forms a disperse phase in the polymer film and an average disperse diameter of the disperse phase is 0.01 to 10.0 μm.

[12] A laminate comprising:
the polymer film as described in any one of [1] to [11]; and
a metal-containing layer disposed on at least one surface side of the polymer film.

[13] A substrate for high-speed communication, comprising the polymer film as described in any one of [1] to [11].

According to the present invention, it is possible to provide a polymer film to which a metal-containing layer is stuck to produce a laminate having an excellent peel strength; and a laminate and a substrate for high-speed communication, each having the polymer film.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

In the present specification, in a case where the polymer film or the laminate has an elongated shape, a length direction means a longitudinal direction and a machine direction (MD) of the polymer film or the laminate, and a width direction means a direction (a lateral direction and a transverse direction (TD)) perpendicular to the length direction in a plane of the polymer film or the laminate.

In the present specification, for each component, one kind of substance corresponding to each component may be used alone, or two or more kinds thereof may be used in combination. Here, in a case where two or more kinds of substances are used for each component, the content of the component indicates a total content of two or more substances unless otherwise specified.

In the present specification, "to" is used in a meaning including numerical values denoted before and after "to" as a lower limit value and an upper limit value, respectively.

In the present specification, the dielectric loss tangent of the polymer film or the liquid crystal polymer included in the polymer film as measured under the conditions of a temperature of 23° C. and a frequency of 28 GHz is also described as a "standard dielectric loss tangent".

Polymer Film

The polymer film of an embodiment of the present invention includes a liquid crystal polymer. In addition, a difference between a melting start temperature and a melting end temperature in differential scanning calorimetry (DSC) in a depth region (hereinafter also referred to as a "surface layer region") up to 10 μm of the polymer film from one surface toward the other surface of the polymer film is 5.0° C. to 50° C.

In a case where a laminate is produced by sticking the polymer film of the embodiment of the present invention and the metal-containing layer to each other, a peel strength between the polymer film and the metal-containing layer is excellent. Details of a reason thereof are not clear, but are usually presumed to be as follows.

In a case where the polymer film is used as a circuit board, it can be used in the form of a laminate obtained by sticking a metal-containing layer (a metal foil and the like) to at least one surface of the polymer film.

Here, in a case where a liquid crystal polymer is melt-molded into a film to obtain a polymer film, the molecules are aligned in a plane direction of the polymer film, and thus, crystallization proceeds. Since the liquid crystal polymer after the proceeding of crystallization is brittle, aggregation fracture easily occurs at an interface with the metal-containing layer, and in a case where the metal-containing layer is peeled from the polymer film due to aggregation fracture, the peeling causes the reliability of a wiring board to be impaired.

In response to such problems, it is presumed that in a differential scanning calorimetry in the surface layer region, the polymer film in which a difference between the melting start temperature and the melting end temperature is within a specific range has lowered aligning properties of the liquid crystal polymer in the surface layer region and lowered crystallinity, and therefore, the occurrence of aggregation fracture was suppressed in a case where the polymer film was used in a laminate together with a metal-containing layer.

Differential Scanning Calorimetry

In the polymer film of the embodiment of the present invention, a difference between a melting start temperature and a melting end temperature in DSC in a surface layer region (a depth region up to 10 μm of the polymer film) from one surface toward the other surface of the polymer film is 5.0° C. to 50° C.

The difference between the melting start temperature and the melting end temperature is preferably 6.0° C. or more, more preferably 8.0° C. or more, and still more preferably 10° C. or more from the viewpoint that the brittleness of the polymer film can be suppressed to further improve the adhesiveness to the metal-containing layer.

The difference between the melting start temperature and the melting end temperature is preferably 40° C. or less, more preferably 35° C. or less, and still more preferably 30° C. or less from the viewpoint that the degree of crystallinity in the surface layer region of the polymer film can be lowered and the adhesiveness to the metal-containing layer can be further improved.

The difference between the melting start temperature and the melting end temperature can be adjusted by, for example, setting a heating temperature of one surface of a polymer film is equal to or higher than the melting point of a liquid crystal polymer, and performing heating so that a temperature of one surface of the polymer film is higher than the temperature of the other surface side by 30° C. or more in a post-heating treatment in a method for producing a polymer film which will be described later.

The melting start temperature (external melting start temperature) means a temperature at which the liquid crystal polymer film starts absorbing heat, and is a temperature at the intersection of a straight line extending a baseline on the low temperature side to the high temperature side and a tangent line drawn at a point where the gradient is maximized on a curve on the low temperature side of a melting peak, located on the low temperature side of the melting peak temperature, and specifically as described in JIS K7121:2012.

The melting end temperature (external melting end temperature) means a temperature at which the liquid crystal polymer film ends absorbing heat, and is set as a temperature at the intersection of a straight line extending a baseline on the high temperature side to the low temperature side and a tangent line drawn at a point where the gradient is maximized on a curve on the high temperature side of a melting peak, located on the high temperature side of the melting peak temperature, and specifically as described in JIS K7121:2012.

The melting start temperature and the melting end temperature are obtained by analyzing the DSC curve, and the difference between the melting start temperature and the melting end temperature is determined by subtracting the melting start temperature from the melting end temperature.

Here, the DSC curve is a curve showing changes in the amounts of heat absorption and heat generation of a film with the horizontal axis as a temperature and the vertical axis as a heat flow, and the measurement is performed by a method according to JIS K7122:2012 (heat flux differential scanning calorimetry) using a differential scanning calorimeter. Detailed measurement conditions thereof are as described in the section of Examples. For example, in a case where a differential scanning calorimeter (DSC-60A, manufactured by Shimadzu Corporation) is used, the melting start temperature and the melting end temperature are determined by a bundled analysis software (TA-60, manufactured by Shimadzu Corporation).

The melting peak temperature in the differential scanning calorimetry in the depth region from one surface up to 10 μm of the polymer film is preferably 280° C. to 350° C., and from the viewpoint that the effect of the present invention is more excellent, the melting peak temperature is preferably 290° C. to 340° C., more preferably 300° C. to 330° C., and still more preferably 310° C. to 320° C.

The melting peak temperature in the differential scanning calorimetry of the entire polymer film is preferably 270° C. to 360° C., more preferably 280° C. to 350° C., and still more preferably 290° C. to 340° C. from the viewpoint that the effect of the present invention is more excellent.

The melting peak temperature is obtained by analyzing the DSC curve and means a temperature of an apex in a portion where the DSC curve leaves the baseline and returns to the baseline again.

The DSC curve is measured by the above-mentioned method, and a detailed measurement method therefor is as shown in the section of Examples. For example, in a case where the differential scanning calorimeter (DSC-60A, manufactured by Shimadzu Corporation) is used, the melting peak temperature is determined by bundled analysis software (TA-60, manufactured by Shimadzu Corporation).

An area A1 of a melting peak in differential scanning calorimetry in the depth region from one surface up to 10 μm of the polymer film is preferably smaller than an area A2 of a melting peak (the area A2−the area A1>0) in differential scanning calorimetry of the entire polymer film (that is, from one surface toward the other surface of the polymer film).

With this, the effect of the present invention is more excellent. Details of a reason thereof are unclear, but are presumed to be the following reasons. The area A1 and the area A2 are related to the aligning properties of the liquid crystal polymer included in the polymer film, and there is a tendency that in a case where the area of the melting peak is large, the aligning properties of the liquid crystal polymer are high, and in a case where the area of the melting peak is small, the aligning properties of the liquid crystal polymer are low. That is, it is presumed that in a case where the area A1 is smaller than the area A2, the liquid crystal polymer in the surface layer region has lower aligning properties than the liquid crystal polymer included in other regions of the polymer film, and therefore, aggregation fracture in a case of forming a laminate is suppressed.

The area A1 is preferably 1.0 to 17.0 J/g, more preferably 1.0 to 12.0 J/g, still more preferably 1.5 to 10.0 J/g, and even still more preferably 2.0 to 5.0 J/g from the viewpoint that the effect of the present invention is more excellent.

The area A2 is preferably 3.0 J/g or more, more preferably 3.5 J/g or more, and still more preferably 4.0 J/g or more from the viewpoint that the effect of the present invention is more excellent. Incidentally, the upper limit of the area A2 is not particularly limited, but is usually 30 J/g or less.

The value of the area A1, the value of the area A2, and the difference between the area A1 and the area A2 can be adjusted by, for example, setting a heating temperature of one surface of a polymer film to equal to or higher than the melting point of a liquid crystal polymer, and performing heating so that a temperature of one surface of the polymer film is higher than the temperature of the other surface side by 30° C. or more in a post-heating treatment in a method for producing a polymer film which will be described later.

The area A1 and the area A2 are obtained by analyzing the DSC curve, and means an area of a portion surrounded by the straight line connecting a point corresponding to the melting start temperature with a point corresponding to the melting end temperature on the DSC curve, and the DSC curve.

Hereinbelow, the area A1 and the area A2 will be described in detail with reference to the drawings.

Figure 1:
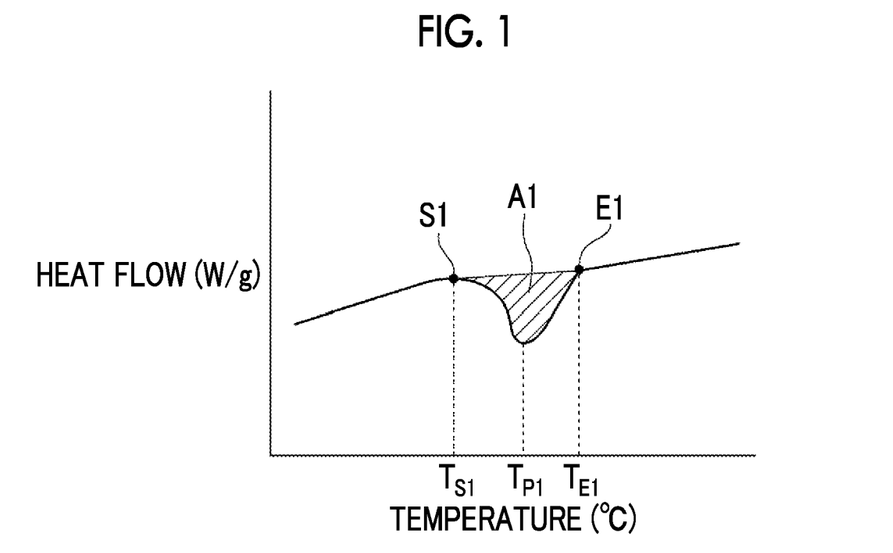
FIG. 1 is a view showing an example of a DSC curve obtained by differential scanning calorimetry of a surface layer region of a polymer film.

FIG. 1 is a view showing an example of a DSC curve measured by a method according to JIS K7122 for a surface layer region of the polymer film. In addition, FIG. 2 is a view showing an example of a DSC curve measured by a method according to JIS K7122 for the entire polymer film.

As shown in FIG. 1, the area A1 is also the area of a region surrounded by a straight line connecting a point S1 on the DSC curve corresponding to the melting start temperature $T_{S1}$ on the lower temperature side than the melting peak temperature $T_{P1}$ with a point E1 on the DSC curve corresponding to the melting end temperature $T_{E1}$ on the higher temperature side than the melting peak temperature $T_{P1}$, and the DSC curve.

Figure 2:
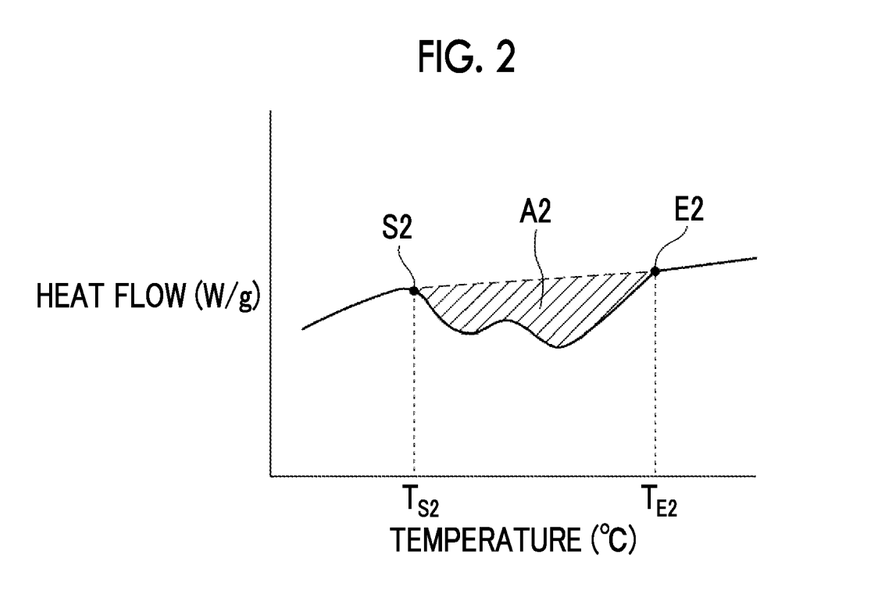
FIG. 2 is a view showing an example of a DSC curve obtained by differential scanning calorimetry of the entire polymer film.

In addition, as shown in FIG. 2, the area A2 is an area surrounded by a region surrounded by a straight line connecting a point S2 on the DSC curve corresponding to the melting start temperature $T_{S2}$ with a point E2 on the DSC curve corresponding to the melting end temperature $T_{E2}$, and the DSC curve.

In the measurement of the area A1 and the area A2, the DSC curve is measured by the above-mentioned method, and a detailed measurement method thereof is as shown in the section of Examples. For example, in a case where the differential scanning calorimeter (DSC-60A, manufactured by Shimadzu Corporation) is used, the area A1 and the area A2 are determined by bundled analysis software (TA-60, manufactured by Shimadzu Corporation).

Components

Hereinafter, the components included in the polymer film will be described in detail.

Liquid Crystal Polymer

A liquid crystal polymer included in the polymer film of the embodiment of the present invention is not particularly limited, and examples thereof include a liquid crystal polymer which can be melt-molded.

As the liquid crystal polymer, a thermotropic liquid crystal polymer is preferable. The thermotropic liquid crystal polymer means a polymer which exhibits liquid crystallinity in a molten state in case of heating it in a predetermined temperature range.

The thermotropic liquid crystal polymer is not particularly limited in terms of the chemical composition as long as it is a melt-moldable liquid crystal polymer, and examples thereof include a thermoplastic liquid crystal polyester and a thermoplastic polyester amide with an amide bond introduced into the thermoplastic liquid crystal polyester.

As the liquid crystal polymer, for example, the thermoplastic liquid crystal polymer described in WO2015/064437A and JP2019-116586A can be used.

More specific examples of the liquid crystal polymer include a thermoplastic liquid crystal polyester or thermoplastic liquid crystal polyester amide having a repeating unit derived from at least one selected from the group consisting of an aromatic hydroxycarboxylic acid, an aromatic or aliphatic diol, an aromatic or aliphatic dicarboxylic acid, an aromatic diamine, an aromatic hydroxyamine, and an aromatic aminocarboxylic acid.

Examples of the aromatic hydroxycarboxylic acid include parahydroxybenzoic acid, metahydroxybenzoic acid, 6-hydroxy-2-naphthoic acid, and 4-(4-hydroxyphenyl)benzoic acid. These compounds may have substituents such as a halogen atom, a lower alkyl group, and a phenyl group. Among these, the parahydroxybenzoic acid or the 6-hydroxy-2-naphthoic acid is preferable.

As the aromatic or aliphatic diol, the aromatic diol is preferable. Examples of the aromatic diol include hydroquinone, 4,4'-dihydroxybiphenyl, 3,3'-dimethyl-1,1'-biphenyl-4,4'-diol, and acylated products thereof, and hydroquinone or 4,4'-dihydroxybiphenyl is preferable.

As the aromatic or aliphatic dicarboxylic acid, the aromatic dicarboxylic acid is preferable. Examples of the aromatic dicarboxylic acid include terephthalic acid, isophthalic acid, and 2,6-naphthalenedicarboxylic acid, and terephthalic acid is preferable.

Examples of the aromatic diamine, the aromatic hydroxyamine, and the aromatic aminocarboxylic acid include p-phenylenediamine, 4-aminophenol, and 4-aminobenzoic acid.

In addition, it is preferable that the liquid crystal polymer has at least one selected from the group consisting of the repeating units represented by Formulae (1) to (3).

—O—Ar1-CO— (1)

—CO—Ar2-CO— (2)

—X—Ar3-Y— (3)

In Formula (1), Ar1 represents a phenylene group, a naphthylene group, or a biphenylylene group.

In Formula (2), Ar2 represents a phenylene group, a naphthylene group, a biphenylylene group, or a group represented by Formula (4).

In Formula (3), Ar3 represents a phenylene group, a naphthylene group, a biphenylylene group, or the group represented by Formula (4), and X and Y each independently represent an oxygen atom or an imino group.

—Ar4-Z—Ar5- (4)

In Formula (4), Ar4 and Ar5 each independently represent a phenylene group or a naphthylene group, and Z represents an oxygen atom, a sulfur atom, a carbonyl group, a sulfonyl group, or an alkylene group.

The phenylene group, the naphthylene group, and the biphenylylene group may have a substituent selected from the group consisting of a halogen atom, an alkyl group, and an aryl group.

Among those, the liquid crystal polymer preferably has at least one selected from the group consisting of the repeating unit derived from an aromatic hydroxycarboxylic acid represented by Formula (1), the repeating unit derived from an aromatic diol represented by Formula (3), in which both X and Y are oxygen atoms, and the repeating unit derived from an aromatic dicarboxylic acid represented by Formula (2).

In addition, the liquid crystal polymer more preferably has at least a repeating unit derived from an aromatic hydroxycarboxylic acid, still more preferably has at least a repeating unit derived from parahydroxybenzoic acid, particularly preferably has at least one selected from the group consisting of the repeating unit derived from parahydroxybenzoic acid and the repeating unit derived from 6-hydroxy-2-naphthoic acid, and most preferably has the repeating unit derived from parahydroxybenzoic acid and the repeating unit derived from 6-hydroxy-2-naphthoic acid.

In addition, as another preferred aspect from the viewpoint that the effect of the present invention is more excellent, the liquid crystal polymer preferably has at least one selected from the group consisting of the repeating unit derived from 6-hydroxy-2-naphthoic acid, the repeating unit derived from an aromatic diol, the repeating unit derived from terephthalic acid, and the repeating unit derived from a 2,6-naphthalenedicarboxylic acid, and more preferably has all of the repeating unit derived from 6-hydroxy-2-naphthoic acid, the repeating unit derived from an aromatic diol, the repeating unit derived from terephthalic acid, and the repeating unit derived from 2,6-naphthalenedicarboxylic acid.

In a case where the liquid crystal polymer includes the repeating unit derived from an aromatic hydroxycarboxylic acid, a compositional ratio thereof is preferably 50% to 65% by mole with respect to all the repeating units of the liquid crystal polymer. In addition, it is also preferable that the liquid crystal polymer has only the repeating unit derived from an aromatic hydroxycarboxylic acid.

In a case where the liquid crystal polymer includes the repeating unit derived from an aromatic diol, a compositional ratio thereof is preferably 17.5% to 25% by mole with respect to all the repeating units of the liquid crystal polymer.

In a case where the liquid crystal polymer includes the repeating unit derived from an aromatic dicarboxylic acid, a compositional ratio thereof is preferably 11% to 23% by mole with respect to all the repeating units of the liquid crystal polymer.

In a case where the liquid crystal polymer includes the repeating unit derived from any of an aromatic diamine, an aromatic hydroxyamine, and an aromatic aminocarboxylic acid, a compositional ratio thereof is preferably 2% to 8% by mole with respect to all the repeating units of the liquid crystal polymer.

A method for synthesizing the liquid crystal polymer is not particularly limited, and the compound can be synthesized by polymerizing the compound by a known method such as melt polymerization, solid phase polymerization, solution polymerization, and slurry polymerization.

As the liquid crystal polymer, a commercially available product may be used. Examples of the commercially available product of the liquid crystal polymer include "LAPEROS" manufactured by Polyplastics Co., Ltd., "VECTRA" manufactured by Celanese Corporation, "UENO LCP" manufactured by Ueno Fine Chemicals Industry, Ltd., "SUMIKA SUPER LCP" manufactured by Sumitomo Chemical Co., Ltd., "Xydar" manufactured by ENEOS LC Co., Ltd., and "Siveras" manufactured by Toray Industries, Inc.

Furthermore, the liquid crystal polymer may form a chemical bond in the polymer film with a crosslinking agent, a compatible component (reactive compatibilizer), or the like which is an optional component. The same applies to components other than the liquid crystal polymer.

The standard dielectric loss tangent of the liquid crystal polymer is preferably 0.005 or less, more preferably 0.003 or less, and still more preferably 0.002 or less from the viewpoint that a polymer film having a low standard dielectric loss tangent (preferably a standard dielectric loss tangent of 0.005 or less) can be easily produced. The lower limit value is not particularly limited, and may be, for example, 0.0001 or more.

In a case where the polymer film includes two or more kinds of liquid crystal polymers, the "dielectric loss tangent of the liquid crystal polymer" means a mass-average value of the dielectric loss tangents of two or more kinds of liquid crystal polymers.

The standard dielectric loss tangent of the liquid crystal polymer included in the polymer film can be measured by the following method.

First, after performing immersion in an organic solvent (for example, pentafluorophenol) in an amount of 1,000 times by mass with respect to the total mass of the polymer film, the mixture is heated at 120° C. for 12 hours to elute the organic solvent-soluble components including the liquid crystal polymer into the organic solvent. Next, the eluate including the liquid crystal polymer and the non-eluted components are separated by filtration. Subsequently, acetone is added to the eluate as a poor solvent to precipitate a liquid crystal polymer, and the precipitate is separated by filtration.

A standard dielectric loss tangent of the liquid crystal polymer can be obtained by filling a polytetrafluoroethylene (PTFE) tube (outer diameter: 2.5 mm, inner diameter: 1.5 mm, length 10 mm) with the obtained precipitate, measuring the dielectric characteristics by a cavity resonator perturbation method under the conditions of a temperature of 23° C. and a frequency of 28 GHz, using a cavity resonator (for example, "CP-531" manufactured by Kanto Electronics Application & Development, Inc.), and correcting the influence of voids in the PTFE tube by a Bruggeman formula and a void ratio.

The void ratio (volume fraction of the void in the tube) is calculated as follows. The volume of a space inside the tube is determined from the inner diameter and the length of the tube. Next, the weights of the tube before and after filling the precipitate are measured to determine the mass of the filled precipitate, and then the volume of the filled precipitate is determined from the obtained mass and the specific gravity of the precipitate. The void ratio can be calculated by dividing the volume of the precipitate thus obtained by the volume of the space in the tube determined above to calculate a filling rate.

Furthermore, in a case where a commercially available product of the liquid crystal polymer is used, a numerical value of the dielectric loss tangent described as a catalog value of the commercially available product may be used.

As for the liquid crystal polymer, the melting point Tm is preferably 250° C. or higher, more preferably 280° C. or higher, and still more preferably 310° C. or higher from the viewpoint that the heat resistance is more excellent.

The upper limit value of the melting point Tm of the liquid crystal polymer is not particularly limited, but is preferably 400° C. or lower, and more preferably 380° C. or lower from the viewpoint that the moldability is more excellent.

The melting point Tm of the liquid crystal polymer can be determined by measuring a temperature at which the endothermic peak appears, using a differential scanning calorimeter ("DSC-60A" manufactured by Shimadzu Corporation). In a case where a commercially available product of the liquid crystal polymer is used, the melting point Tm described as the catalog value of the commercially available product may be used.

A number-average molecular weight (Mn) of the liquid crystal polymer is not particularly limited, but is preferably 10,000 to 600,000, and more preferably 30,000 to 150,000.

The number-average molecular weight of the liquid crystal polymer is a conversion value of standard polystyrene by gel permeation chromatography (GPC).

The measurement of GPC can be carried out with the following device and conditions.

"HLC (registered trademark)-8320GPC" manufactured by Tosoh Corporation is used as a measuring device, and two TSKgel (registered trademark) SuperHM-H (6.0 mm ID×15 cm, manufactured by Tosoh Corporation) are used as a column. A solvent (eluent) for dissolving the liquid crystal polymer is not particularly limited, and examples thereof include a mixed solution of pentafluorophenol/chloroform=1/2 (mass ratio). The measurement conditions are as follows: a sample concentration of 0.03% by mass, a flow rate of 0.6 ml/min, a sample injection amount of 20 μL, and a measurement temperature of 40° C. Detection is performed using an RI (differential refractometry) detector.

The calibration curve was created using 8 samples of "F-40", "F-20", "F-4", "F-1", "A-5000", "A-2500", "A-1000", and "n-propylbenzene" which are "Standard Samples TSK standard, polystyrene" (manufactured by TOSOH Corporation).

The polymer film may include one kind of liquid crystal polymer alone, or may include two or more kinds of liquid crystal polymers.

A content of the liquid crystal polymer is preferably 40% to 99.9% by mass, more preferably 50% to 95% by mass, and still more preferably 60% to 90% by mass with respect to the total mass of the polymer film.

Furthermore, the content of the liquid crystal polymer and the components which will be described later in the polymer film can be measured by a known method such as infrared spectroscopy and gas chromatography mass spectrometry.

Optional Components

The polymer film may include optional components other than the polymer. Examples of the optional components include a polyolefin, compatible components, a heat stabilizer, and additives which will be described below.

Polyolefin

The polymer film may include a polyolefin.

In the present specification, the "polyolefin" is intended to be a polymer having a repeating unit derived from an olefin (a polyolefin resin).

The polymer film preferably includes the liquid crystal polymer and the polyolefin, and more preferably includes the liquid crystal polymer, the polyolefin, and the compatible component.

By using the polyolefin together with the liquid crystal polymer, a polymer film having a disperse phase formed of the polyolefin can be produced. A method for producing the polymer film having a disperse phase will be described later.

The polyolefin may be linear or branched. In addition, the polyolefin may have a cyclic structure such as a polycycloolefin.

Examples of the polyolefin include polyethylene, polypropylene (PP), polymethylpentene (TPX and the like manufactured by Mitsui Chemicals, Inc.), hydrogenated polybutadiene, a cycloolefin polymer (COP, ZEONOR manufactured by ZEON Corporation, and the like), and a cycloolefin copolymer (COC, APEL manufactured by Mitsui Chemicals, Inc., and the like).

The polyethylene may be either high density polyethylene (HDPE) or low density polyethylene (LDPE). In addition, the polyethylene may be linear low density polyethylene (LLDPE).

The polyolefin may be a copolymer of an olefin and a copolymerization component other than the olefin, such as acrylate, methacrylate, styrene, and/or a vinyl acetate-based monomer.

Examples of the polyolefin as the copolymer include a styrene-ethylene/butylene-styrene copolymer (SEBS). SEBS may be hydrogenated.

However, from the viewpoint that the effect of the present invention is more excellent, it is preferable that a copolymerization ratio of the copolymerization component other than the olefin is small, and it is more preferable that the copolymerization component is not included. For example, a content of the copolymerization component is preferably 0% to 40% by mass, and more preferably 0% to 5% by mass with respect to the total mass of the polyolefin.

In addition, the polyolefin is preferably substantially free of a reactive group which will be described below, and a content of the repeating unit having the reactive group is preferably 0% to 3% by mass with respect to the total mass of the polyolefin.

As the polyolefin, polyethylene, COP, or COC is preferable, polyethylene is more preferable, and the low-density polyethylene (LDPE) is still more preferable.

The polyolefins may be used alone or in combination of two or more kinds thereof.

In a case where the polymer film includes a polyolefin, a content thereof is preferably 0.1% by mass or more, and more preferably 5% by mass or more with respect to the total mass of the polymer film from the viewpoint that the surface property of the polymer film is more excellent. The upper limit is not particularly limited, but is preferably 50% by mass or less, more preferably 40% by mass or less, and still more preferably 25% by mass or less with respect to the total mass of the polymer film from the viewpoint that the smoothness of the polymer film is more excellent. In addition, in a case where the content of the polyolefin is 50% by mass or less, a thermal deformation temperature thereof can be easily raised sufficiently and the solder heat resistance can be improved.

Compatible Components

Examples of the compatible component include a polymer (non-reactive compatibilizer) having a moiety having high compatibility or affinity with the liquid crystal polymer and a polymer (reactive compatibilizer) having a reactive group for a phenol-based hydroxyl group or a carboxyl group at the terminal of the liquid crystal polymer.

As the reactive group included in the reactive compatibilizer, an epoxy group or a maleic acid anhydride group is preferable.

As the compatible component, a copolymer having a moiety having a high compatibility or a high affinity with the polyolefin is preferable. In addition, in a case where the polymer film includes a polyolefin and a compatible component, a reactive compatibilizer is preferable as the compatible component from the viewpoint that the polyolefin can be finely dispersed.

Furthermore, the compatible component (in particular, the reactive compatibilizer) may form a chemical bond with a component such as a liquid crystal polymer in the polymer film.

Examples of the reactive compatibilizer include an epoxy group-containing polyolefin-based copolymer, an epoxy group-containing vinyl-based copolymer, a maleic acid anhydride-containing polyolefin-based copolymer, a maleic acid anhydride-containing vinyl copolymer, an oxazoline group-containing polyolefin-based copolymer, an oxazoline group-containing vinyl-based copolymer, and a carboxyl group-containing olefin-based copolymer. Among these, the epoxy group-containing polyolefin-based copolymer or the maleic acid anhydride-grafted polyolefin-based copolymer is preferable.

Examples of the epoxy group-containing polyolefin-based copolymer include an ethylene/glycidyl methacrylate copolymer, an ethylene/glycidyl methacrylate/vinyl acetate copolymer, an ethylene/glycidyl methacrylate/methyl acrylate copolymer, a polystyrene graft copolymer to an ethylene/glycidyl methacrylate copolymer (EGMA-g-PS), a polymethylmethacrylate graft copolymer to an ethylene/glycidyl methacrylate copolymer (EGMA-g-PMMA), and an acrylonitrile/styrene graft copolymer to an ethylene/glycidyl methacrylate copolymer (EGMA-g-AS).

Examples of a commercially available product of the epoxy group-containing polyolefin-based copolymer include BONDFIRST 2C and BONDFIRST E manufactured by Sumitomo Chemical Co., Ltd.; Lotadar manufactured by Arkema S.A.; and Modiper A4100 and Modiper A4400 manufactured by NOF Corporation.

Examples of the epoxy group-containing vinyl-based copolymer include a glycidyl methacrylate grafted polystyrene (PS-g-GMA), a glycidyl methacrylate grafted polymethyl methacrylate (PMMA-g-GMA), and a glycidyl methacrylate grafted polyacrylonitrile (PAN-g-GMA).

Examples of the maleic acid anhydride-containing polyolefin-based copolymer include a copolymer of maleic acid anhydride and ethylene (E-MAH), a maleic acid anhydride grafted polypropylene (PP-g-MAH), a maleic acid anhydride grafted ethylene/propylene rubber (EPR-g-MAH), and a maleic acid anhydride grafted ethylene/propylene/diene rubber (EPDM-g-MAH).

Examples of a commercially available product of the maleic acid anhydride-containing polyolefin-based copolymer include Orevac G series manufactured by Arkema S.A.; FUSABOND E series manufactured by The Dow Chemical Company; and ADMER manufactured by Mitsui Chemicals, Inc.

Examples of the maleic acid anhydride-containing vinyl copolymer include a maleic acid anhydride grafted polystyrene (PS-g-MAH), a maleic acid anhydride grafted styrene/butadiene/styrene copolymer (SBS-g-MAH), a maleic acid anhydride grafted styrene/ethylene/butene/styrene copolymer (SEBS-g-MAH and a styrene/maleic acid anhydride copolymer, and an acrylic acid ester/maleic acid anhydride copolymer.

Examples of a commercially available product of the maleic acid anhydride-containing vinyl copolymer include TUFTEC M Series (SEBS-g-MAH) manufactured by Asahi Kasei Corporation.

In addition to those, examples of the compatible component include oxazoline-based compatibilizers (for example, a bisoxazoline-styrene-maleic acid anhydride copolymer, a bisoxazoline-maleic acid anhydride-modified polyethylene, and a bisoxazoline-maleic acid anhydride-modified polypropylene), elastomer-based compatibilizers (for example, an aromatic resin and a petroleum resin), ethylene glycidyl methacrylate copolymer, an ethylene maleic acid anhydride ethyl acrylate copolymer, ethylene glycidyl methacrylate-acrylonitrile styrene, acid-modified polyethylene wax, a COOH-modified polyethylene graft polymer, a COOH-modified polypropylene graft polymer, a polyethylene-polyamide graft copolymer, a polypropylene-polyamide graft copolymer, a methyl methacrylate-butadiene-styrene copolymer, acrylonitrile-butadiene rubber, an EVA-PVC-graft copolymer, a vinyl acetate-ethylene copolymer, an ethylene-$\alpha$-olefin copolymer, a propylene-$\alpha$-olefin copolymer, a hydrogenated styrene-isopropylene-block copolymer, and an amine-modified styrene-ethylene-butene-styrene copolymer.

In addition, as the compatible component, an ionomer resin may be used.

Examples of such an ionomer resin include an ethylene-methacrylic acid copolymer ionomer, an ethylene-acrylic acid copolymer ionomer, a propylene-methacrylic acid copolymer ionomer, a butylene-acrylic acid copolymer ionomer, a propylene-acrylic acid copolymer ionomer, an ethylene-vinyl sulfonic acid copolymer ionomer, a styrene-methacrylic acid copolymer ionomer, a sulfonated polystyrene ionomer, a fluorine-based ionomer, a telechelic polybutadiene acrylic acid ionomer, a sulfonated ethylene-propylene-diene copolymer ionomer, hydrogenated polypentamer ionomer, a polypentamer ionomer, a poly(vinylpyridium salt) ionomer, a poly(vinyltrimethylammonium salt) ionomer, a poly(vinyl benzyl phosphonium salt) ionomer, a styrene-butadiene acrylic acid copolymer ionomer, a polyurethane ionomer, a sulfonated styrene-2-acrylamide-2-methyl propane sulfate ionomer, an acid-amine Ionomer, an aliphatic ionene, and an aromatic ionene.

In a case where the polymer film includes the compatible component, a content thereof is preferably 0.05% to 30% by mass, more preferably 0.1% to 20% by mass, and still more preferably 0.5% to 10% by mass with respect to the total mass of the polymer film.

Heat Stabilizer

The polymer film may include a heat stabilizer for the purpose of suppressing thermal oxidative deterioration during film production through melt extrusion, and improving the leveling and the smoothness of a surface of the polymer film.

Examples of the heat stabilizer include a phenol-based stabilizer and an amine-based stabilizer, each having a radical scavenging action; a phosphite-based stabilizer and a sulfur-based stabilizer, each having a decomposition action of a peroxide; and a hybrid stabilizer having a radical scavenging action and a decomposition action of a peroxide.

Examples of the phenol-based stabilizer include a hindered phenol-based stabilizer, a semi-hindered phenol-based stabilizer, and a less hindered phenol-based stabilizer.

Examples of a commercially available product of the hindered phenol-based stabilizer include ADK STAB AO-20, AO-50, AO-60, and AO-330 manufactured by ADEKA Corporation; and Irganox 259, 1035, and 1098 manufactured by BASF.

Examples of a commercially available product of the semi-hindered phenol-based stabilizer include ADK STAB AO-80 manufactured by ADEKA Corporation; and Irganox 245 manufactured by BASF.

Examples of a commercially available product of the less hindered phenol-based stabilizer include NOCRAC 300 manufactured by Ouchi Shinko Chemical Industrial Co., Ltd.; and ADK STAB AO-30 and AO-40 manufactured by ADEKA Corporation.

Examples of a commercially available product of the phosphite-based stabilizer include ADK STAB-2112, PEP-8, PEP-36, and HP-10 manufactured by ADEKA Corporation.

Examples of a commercially available product of the hybrid stabilizer include SUMILIZER GP manufactured by Sumitomo Chemical Co., Ltd.

As the heat stabilizer, the hindered phenol-based stabilizer, the semi-hindered phenol-based stabilizer, or the phosphite-based stabilizer is preferable, and the hindered phenol-based stabilizer is more preferable from the viewpoint that the heat stabilization effect is more excellent. On the other hand, in terms of electrical characteristics, a semi-hindered phenol-based stabilizer or a phosphite-based stabilizer is more preferable.

The heat stabilizers may be used alone or in combination of two or more kinds thereof.

In a case where the polymer film includes the heat stabilizer, a content thereof is preferably 0.0001% to 10% by mass, more preferably 0.01% to 5% by mass, and still more preferably 0.1% to 2% by mass with respect to the total mass of the polymer film.

Additives

The polymer film may include an additive other than the components. Examples of the additive include a plasticizer, a lubricant, inorganic and organic particles, and a UV absorbing material.

Examples of the plasticizer include an alkylphthalyl alkyl glycolate compound, a bisphenol compound (bisphenol A, bisphenol F), a phosphoric acid ester compound, a carboxylic acid ester compound, and a polyhydric alcohol. A content of the plasticizer may be 0% to 5% by mass with respect to the total mass of the polymer film.

Examples of the lubricant include a fatty acid ester and a metal soap (for example, a stearic acid inorganic salt). A content of the lubricant may be 0% to 5% by mass with respect to the total mass of the polymer film.

The polymer film may contain inorganic particles and/or organic particles as a reinforcing material, a matting agent, a dielectric constant, or a dielectric loss tangent improving material. Examples of inorganic particles include silica, titanium oxide, barium sulfate, talc, zirconia, alumina, silicon nitride, silicon carbide, calcium carbonate, silicate, glass beads, graphite, tungsten carbide, carbon black, clay, mica, carbon fiber, glass fiber, and metal powder. Examples of the organic particles include crosslinked acryl and crosslinked styrene. A content of the inorganic particles and the organic particles may be 0% to 50% by mass with respect to the total mass of the polymer film.

Examples of the UV absorbing material include a salicylate compound, a benzophenone compound, a benzotriazole compound, a substituted acrylonitrile compound, and an s-triazine compound. A content of the UV absorbing material may be 0% to 5% by mass with respect to the total mass of the polymer film.

In addition, the polymer film may include a polymer component other than the liquid crystal polymer.

Examples of the polymer component include thermoplastic polymers such as polyethylene terephthalate, modified polyethylene terephthalate, polycarbonate, polyarylate, polyamide, polyphenylene sulfide, and polyester ether ketone.

Physical Properties of Polymer Film

Thickness

A thickness of the polymer film is preferably more than 10 µm and 1,000 µm or less, more preferably 15 to 500 µm, and still more preferably 20 to 250 µm.

Furthermore, the thickness of the polymer film is an arithmetic mean value of the measured values obtained by measuring the thickness of the polymer film at any different 100 points from an observed image obtained by observing a cross-section along the thickness direction of a laminate using a scanning electron microscope (SEM).

Dielectric Characteristics

A standard dielectric loss tangent of the polymer film is not particularly limited, and is, for example, 0.0050 or less, preferably 0.0040 or less, more preferably 0.0030 or less, and still more preferably 0.0020 or less. The lower limit value is not particularly limited, and may be 0.0001 or more.

A relative dielectric constant of the polymer film varies depending on the application, but is preferably 2.0 to 4.0, and more preferably 2.5 to 3.5.

The dielectric characteristics including a standard dielectric loss tangent and a relative dielectric constant of the polymer film can be measured by a cavity resonator perturbation method. A specific method for measuring the dielectric characteristics of the polymer film will be described in the section of Examples which will be described later.

Disperse Phase

In a case where the polymer film includes a polyolefin, it is preferable that the polyolefin forms a disperse phase in the polymer film.

The disperse phase means that a phase including a polyolefin is dispersed in the polymer film.

A method for allowing the polyolefin to exist as a disperse phase in the polymer film is not limited, and for example, a disperse phase of a polyolefin can be formed by adjusting each of the contents of the liquid crystal polymer and the polyolefin included in the polymer film to the above-mentioned suitable contents.

An average disperse diameter of the disperse phase is preferably 0.001 to 50.0 μm, more preferably 0.005 to 20.0 μm, and still more preferably 0.01 to 10.0 μm from the viewpoint that the smoothness is more excellent.

The disperse phase is preferably flat, and a smooth surface of the smooth disperse phase is preferably substantially parallel to the polymer film.

In addition, from the viewpoint of reducing the anisotropy of the polymer film, the smooth surface of the smooth disperse phase is preferably substantially circular in a case of being observed from a direction perpendicular to the surface of the polymer film. It is considered that in a case where such a disperse phase is dispersed in the polymer film, a dimensional change which occurs in the polymer film can be absorbed, and more excellent surface properties and smoothness can be realized.

The average disperse diameter of the disperse phase and the shape of the disperse phase are determined from an observation image obtained by observing a cross-section of the laminate in the thickness direction using a scanning electron microscope (SEM). A detailed method for measuring the average disperse diameter of the disperse phase will be described in the section of Examples which will be described later.

Linear Expansion Coefficient

The linear expansion coefficient in a first direction in a plane of the polymer film and the linear expansion coefficient in a second direction orthogonal to the first direction in the plane of the polymer film are both preferably 0 to 40 ppm/° C., more preferably 5 to 30 ppm/° C., and still more preferably 10 to 25 ppm/° C. Since in a case where the linear expansion coefficient of the polymer film is within the range, a difference thereof from the linear expansion coefficient of the copper foil (18 ppm/° C.) is small, a warpage of the laminate including the copper foil and the polymer film in the case of producing the laminate can be suppressed and an adhesiveness between the copper foil and the polymer film can be further improved.

The linear expansion coefficient of the polymer film can be adjusted by, for example, a stretching condition during the film production, a temperature condition during a post-heating treatment, a heating time, and the like.

A method for measuring the linear expansion coefficient in the in-plane direction of the polymer film will be described in Examples which will be described later.

The polymer film may have a monolayer structure or a laminated structure in which a plurality of layers are laminated. Furthermore, the term "monolayer structure" of the polymer film means that the polymer film is composed of the same material over the entire thickness.

Method for Producing Polymer Film

A method for producing the polymer film is not particularly limited, but the polymer film is preferably formed using a composition including at least a liquid crystal polymer and a non-liquid crystal compound, and is more preferably formed using a composition including at least a liquid crystal polymer having a reactive group at a terminal and a non-liquid crystal compound having a functional group that reacts with or interacts with the reactive group.

Examples of preferred aspects of the method for producing a polymer film include a production method including a pelletizing step of kneading each of the above-mentioned components to obtain pellets, and a film producing step of using the pellets and obtaining a polymer film. The steps will be described below.

Pelletizing Step (1) Forms of Raw Material

As the liquid crystal polymer used for the film production, pellet-shaped, flake-shaped, or powdered polymer can be used as they are, but for the purpose of stabilizing the film production or uniformly dispersing an additive (which means a component other than the liquid crystal polymer; the same applies hereinafter), pellets obtained by kneading one or more kinds of raw materials (meaning at least one of a liquid crystal polymer or an additive; the same applies hereinafter) using an extruder, and performing pelletization before use are preferably used.

Hereinafter, a mixture including a raw material that is a polymer and a polymer used for producing a polymer film is also collectively referred to as a resin.

(2) Drying or Drying Alternative by Vent

Before pelletizing, it is preferable to dry the liquid crystal polymer and the additive in advance. Examples of a drying method include a method of circulating heated air having a low dew point, and a method of dehumidifying by vacuum drying. In particular, in a case of a resin which is easily oxidized, vacuum drying or drying using an inert gas is preferable.

(3) Method for Supplying Raw Materials

A method for supplying raw materials may be a method in which raw materials are mixed in advance before being kneaded and pelletized, and then supplied, a method in which raw materials are separately supplied into the extruder so as to be in a fixed ratio, or a method of a combination of the both.

(4) Atmosphere During Extrusion

In a case of melt extrusion, within a range not interfering with uniform dispersion, it is preferable to prevent thermal and oxidative deterioration as much as possible, and it is also effective to reduce an oxygen concentration by reducing the pressure using a vacuum pump or inflowing an inert gas. These methods may be carried out alone or in combination.

(5) Temperature

A kneading temperature is preferably set to be equal to or lower than a thermal decomposition temperature of the liquid crystal polymer and the additive, and is preferably set to a low temperature as much as possible within a range in which a load of the extruder and a decrease in uniform kneading property are not a problem.

(6) Pressure

A kneading resin pressure during pelletization is preferably 0.05 to 30 MPa. In a case of a resin in which coloration or gel is likely to be generated due to shearing, it is preferable to apply an internal pressure of approximately 1 to 10 MPa to the inside of the extruder to fill the inside of a twin-screw extruder with the resin raw material.

(7) Pelletizing Method

As a pelletizing method, a method of solidifying a noodle-shaped extrusion in water and then cutting the extrusion is generally used, but the pelletization may be performed by an under-water cut method for cutting while directly extruding from a mouthpiece into water after melting with the extruder, or a hot cut method for cutting while still hot.

(8) Pellet Size

A pellet size is preferably 1 to 300 mm$^2$ in a cross-sectional area and 1 to 30 mm in a length, and more preferably 2 to 100 mm$^2$ in a cross-sectional area and 1.5 to 10 mm in a length.

Drying (1) Purpose of Drying

Before the molten film production, it is preferable to reduce a moisture and a volatile fraction in the pellets, and it is effective to dry the pellets. In a case where the pellets include a moisture or a volatile fraction, not only appearance is deteriorated due to incorporation of bubbles into a film to be produced or the decrease in a haze, but also physical properties may be deteriorated due to a molecular chain breakage of the liquid crystal polymer, or roll contamination may occur due to generation of monomers or oligomers. In addition, depending on the type of the liquid crystal polymer used, it may be possible to suppress generation of an oxidative crosslinked substance during the molten film production by removing dissolved oxygen by the drying.

(2) Drying Method and Heating Method

In terms of drying efficiency and economical efficiency, a dehumidifying hot-air dryer is generally used as a drying method, but the drying method is not particularly limited as long as a desired moisture content can be obtained. In addition, there is no problem in selecting a more appropriate method according to characteristics of the physical properties of the liquid crystal polymer.

Examples of a heating method include pressurized steam, heater heating, far-infrared irradiation, microwave heating, and a heat medium circulation heating method.

Film Producing Step

Hereinafter, the film producing step will be described.

(1) Extrusion Conditions

Drying of Raw Materials

In the melt plasticization step for pellets using an extruder, it is preferable to reduce a moisture and a volatile fraction in the pellets as in the pelletizing step, and it is effective to dry the pellets.

Method for Supplying Raw Materials

In a case where there are multiple types of raw materials (pellets) input from the extruder supply port, the raw materials may be mixed in advance (premix method), may be separately supplied into the extruder in a fixed ratio, or may be a combination of the both. In addition, in order to stabilize the extrusion, it is generally practiced to reduce a fluctuation of the temperature and a bulk specific gravity of the raw material charged from the supply port. Moreover, in terms of plasticization efficiency, a raw material temperature is preferably high as long as it does not block a supply port by pressure-sensitive adherence, and in a case where the raw material is in an amorphous state, the raw material temperature is preferably in the range of {Glass transition temperature (Tg) (° C.)−150° C.} to {Tg (° C.)−1° C.}, and in a case where the raw material is a crystalline resin, the raw material temperature is preferably in the range of {Melting point (Tm) (° C.)−150° C.} to {Tm (° C.)−1° C.}, and the raw material is heated or kept warm. In addition, in terms of plasticization efficiency, the bulk specific gravity of the raw material is preferably 0.3 times or more, and more preferably 0.4 times or more in a case of a molten state. In a case where the bulk specific gravity of the raw material is less than 0.3 times the specific gravity in the molten state, it is also preferable to perform a processing treatment such as compression of the raw material into pseudo-pellets.

Atmosphere During Extrusion

As for the atmosphere during melt extrusion, it is necessary to prevent heat and oxidative deterioration as much as possible within a range that does not hinder uniform dispersion as in the pelletizing step. It is also effective to inject an inert gas (nitrogen or the like), reduce the oxygen concentration in the extruder by using a vacuum hopper, and provide a vent port in the extruder to reduce the pressure by a vacuum pump. These depressurization and injection of the inert gas may be carried out independently or in combination.

Rotation Speed

A rotation speed of the extruder is preferably 5 to 300 rpm, more preferably 10 to 200 rpm, and still more preferably 15 to 100 rpm. In a case where the rotation rate is set to the lower limit value or more, the retention time is shortened, the decrease in the molecular weight can be suppressed due to thermal deterioration, and discoloration can be suppressed. In a case where the rotation rate is set to the upper limit value or less, a breakage of a molecular chain due to shearing can be suppressed, and a decrease in the molecular weight and an increase in generation of cross-linked gel can be suppressed. It is preferable to select appropriate conditions for the rotation speed from the viewpoints of both uniform dispersibility and thermal deterioration due to extension of the retention time.

Temperature

A barrel temperature (a supply unit temperature of $T_1$° C., a compression unit temperature of $T_2$° C., and a measuring unit temperature of $T_3$° C.) is generally determined by the following method. In a case where the pellets are melt-plasticized at a target temperature T° C. by the extruder, the measuring unit temperature $T_3$ is set to T±20° C. in consideration of the shear calorific value. At this time, $T_2$ is set within a range of $T_3$±20° C. in consideration of extrusion stability and thermal decomposability of the resin. Generally, $T_1$ is set to {$T_2$(° C.)−5° C.} to {$T_2$(° C.)−150° C.}, and the optimum value of $T_1$ is selected in terms of ensuring a friction between the resin and the barrel, which is a driving force (feed force) for feeding the resin, and preheating at the feed unit. In a case of a normal extruder, it is possible to subdivide each zone of $T_1$ to $T_3$ and set the temperature, and by performing settings such that the temperature change between each zone is gentle, it is possible to make it more stable. At this time, T is preferably set to be equal to or lower than the thermal deterioration temperature of the resin, and in a case where the thermal deterioration temperature is exceeded due to the shear heat generation of the extruder, it is generally performed to positively cool and remove the shear heat generation. In addition, in order to achieve both improved dispersibility and thermal deterioration, it is also effective to melt and mix a first half part in the extruder at a relatively high temperature and lower the resin temperature in a second half part.

Pressure

A resin pressure in the extruder is generally 1 to 50 MPa, and in terms of extrusion stability and melt uniformity, the resin pressure is preferably 2 to 30 MPa, and more preferably 3 to 20 MPa. In a case where the pressure in the extruder is 1 MPa or more, a filling rate of the melting in the extruder is sufficient, and therefore, the destabilization of the extrusion pressure and the generation of foreign matter due to the generation of retention portions can be suppressed. In addition, in a case where the pressure in the extruder is 50 MPa or less, it is possible to suppress the excessive shear stress received in the extruder, and therefore, thermal decomposition due to an increase in the resin temperature can be suppressed.

Retention Time

A retention time in the extruder (retention time during the film production) can be calculated from a volume of the extruder portion and a discharge capacity of the polymer, as in the pelletizing step. The retention time is preferably 10 seconds to 60 minutes, more preferably 15 seconds to 45 minutes, and still more preferably 30 seconds to 30 minutes. In a case where the retention time is 10 seconds or more, the melt plasticization and the dispersion of the additive are sufficient. In a case where the retention time is 30 minutes or less, it is preferable from the viewpoint that resin deterioration and discoloration of the resin can be suppressed.

Filtration

Type, Purpose of Installation, and Structure

It is generally used to provide a filtration equipment at the outlet of the extruder in order to prevent damage to the gear pump due to foreign matter included in the raw material and to extend the life of the filter having a fine pore size installed downstream of the extruder. It is preferable to perform so-called breaker plate type filtration in which a mesh-shaped filtering medium is used in combination with a reinforcing plate having a high opening ratio and having strength.

Mesh Size and Filtration Area

A mesh size is preferably 40 to 800 mesh, more preferably 60 to 700 mesh, and still more preferably 100 to 600 mesh. In a case where the mesh size is 40 mesh or more, it is possible to sufficiently suppress foreign matter from passing through the mesh. In addition, in a case where the mesh is 800 mesh or less, the improvement of the filtration pressure increase speed can be suppressed and the mesh replacement frequency can be reduced. In addition, in terms of filtration accuracy and strength maintenance, a plurality of types of filter meshes having different mesh sizes are often superimposed and used. Moreover, since the filtration opening area can be widened and the strength of the mesh can be maintained, the filter mesh may also be reinforced by using a breaker plate. An opening ratio of the breaker plate used is often 30% to 80% in terms of filtration efficiency and strength.

In addition, a screen changer with the same diameter as the barrel diameter of the extruder is often used, but in order to increase the filtration area, a larger diameter filter mesh is used by using a tapered pipe, or a plurality of breaker plates is also sometimes used by branching a flow channel. The filtration area is preferably selected with a flow rate of 0.05 to 5 $g/cm^2$ per second as a guide, more preferably 0.1 to 3 $g/cm^2$, and still more preferably 0.2 to 2 $g/cm^2$.

By capturing foreign matter, the filter is clogged and the filter pressure rises. At that time, it is necessary to stop the extruder and replace the filter, but a type in which the filter can be replaced while continuing extrusion can also be used. In addition, as a measure against an increase in the filtration pressure due to the capture of foreign matter, a measure having a function of lowering the filtration pressure by washing and removing the foreign matter trapped in the filter by reversing the flow channel of the polymer can also be used.

Die

Type, Structure, and Material

The molten resin from which foreign matters have been removed by filtration and in which the temperature has been made uniform by a mixer is continuously sent to the die. The die is not particularly limited as long as it is designed so that the retention of the molten resin is small, and any type of a T die, a fishtail die, or a hanger coat die, commonly used, can also be used. Among these, the hanger coat die is preferable in terms of thickness uniformity and less retention.

Multilayer Film Production

A monolayer film producing device having a low equipment cost is generally used for the production of a film. In addition, a multilayer film producing device may be used in order to provide a functional layer such as a surface protective layer, a pressure-sensitive adhesive layer, an easy adhesion layer, and/or an antistatic layer in an outer layer. Specific examples thereof include a method of performing multilayering using a multilayer feed block and a method of using a multi-manifold die. It is generally preferable to laminate the functional layer thinly on the surface layer, but the layer ratio is not particularly limited.

Cast

The film producing step preferably includes a step of supplying a liquid crystal polymer in a molten state from the supply unit, and a step of landing the liquid crystal polymer in the molten state on a cast roll to form a film. The molten liquid crystal polymer may be cooled and solidified, and wound as it is as the film, or it may be passed between a pair of pressing surfaces and continuously pressed to form a film.

At this time, the unit for supplying the liquid crystal polymer (melt) in a molten state is not particularly limited. For example, as a specific unit for supplying the melt, an extruder which melts the liquid crystal polymer and extrudes it into a film may be used, an extruder and a die may be used, or the liquid crystal polymer may be once solidified into a film and then molten by a heating unit to form a melt, which may be supplied to the film producing step.

In a case where the molten resin extruded from the die into a sheet is pressed by a device having a pair of pressing surfaces, the surface morphology of the pressing surface can be transferred to the film, as well as the aligning properties can be controlled by imparting elongation deformation to the composition including the liquid crystal polymer.

Film Producing Method and Type

Among the methods for forming a raw material in a molten state into a film, it is preferable to pass between two rolls (for example, a touch roll and a chill roll) from the viewpoint that a high pressing pressure can be applied and the film surface shape is excellent. Furthermore, in the present specification, in a case where a plurality of cast rolls for transporting the melt are provided, the cast roll closest to a supply unit (for example, a die) for the most upstream liquid crystal polymer is referred to as a chill roll. In addition, a method of pressing metal belts with each other or a method of combining a roll and a metal belt can also be used. In addition, in some cases, in order to improve the adhesiveness with rolls or metal belts, a film producing method such as a static electricity application method, an air knife method, an air chamber method, and a vacuum nozzle method can be used in combination on a cast drum.

In addition, in a case of obtaining a film having a multilayer structure, it is preferable to obtain the polymer film by pressing a molten polymer extruded from a die in multiple layers, but it is also possible to obtain a film having a multilayer structure by introducing a film having a monolayer structure into a pressing portion in the same manner as for molten laminating. In addition, at this time, films having different inclined structures in the thickness direction can be obtained by changing a circumferential speed difference or an alignment axis direction of the pressing portion, and films having three or more layers can be obtained by performing this step several times.

Furthermore, the touch roll may be periodically vibrated in the TD direction in a case of pressing to afford deformation.

Temperature of Molten Polymer

In terms of the improvement of the moldability of the liquid crystal polymer and the suppression of deterioration, a discharge temperature (resin temperature at an outlet of the supply unit) is preferably (Tm of liquid crystal polymer−10)° C. to (Tm of liquid crystal polymer+40)° C. A standard for the melt viscosity is preferably 50 to 3,500 Pa·s.

It is preferable that the cooling of the molten polymer between the air gaps is as small as possible, and it is preferable to reduce a temperature drop due to the cooling by taking measures such as increasing the film producing speed and shortening the air gap.

Temperature of Touch Roll

A temperature of the touch roll is preferably set to Tg or less of the liquid crystal polymer. In a case where the temperature of the touch roll is Tg or less of the liquid crystal polymer, pressure-sensitive adhesion of the molten polymer to the roll can be suppressed, and therefore, the film appearance is improved. For the same reason, the chill roll temperature is preferably set to Tg or less of the liquid crystal polymer.

Film Producing Procedure for Polymer Film

Film Producing Procedure

In the film producing step, it is preferable to perform the film production by the following procedure in terms of the film producing step for a film and the stabilization of quality.

The molten polymer discharged from the die is landed on a cast roll to form a film, which is then cooled and solidified and wound up as a film.

In a case of pressing the molten polymer, the molten polymer is passed between the first pressing surface and the second pressing surface set at a predetermined temperature, which is then cooled and solidified and wound up as a film.

Stretching Step, Thermal Relaxation Treatment, and Thermal Fixation Treatment

Furthermore, after producing a non-stretched film by the method, the non-stretched film may be continuously or discontinuously stretched and/or subjected to a thermal relaxation treatment or a thermal fixation treatment. For example, each step can be carried out by the combination of the following (a) to (g). In addition, the order of the machine-direction stretching and the cross-direction stretching may be reversed, each step of the machine-direction stretching and the cross-direction stretching may be performed in multiple stages, and each step of the machine-direction stretching and the cross-direction stretching may be combined with oblique-direction stretching or simultaneous biaxial stretching.

(a) Cross-direction stretching
(b) Cross-direction stretching→Thermal relaxation treatment
(c) Machine-direction stretching
(d) Machine-direction stretching→Thermal relaxation treatment
(e) Machine-direction (cross-direction) stretching→Cross-direction (machine-direction) stretching
(f) Machine-direction (cross-direction) stretching→Cross-direction (machine-direction) stretching→Thermal relaxation treatment
(g) Cross-direction stretching→Thermal relaxation treatment→Machine-direction stretching→Thermal relaxation treatment Machine-Direction Stretching The machine-direction stretching can be achieved by making the circumferential speed on the outlet side faster than the circumferential speed on the inlet side while heating between the two pairs of rolls. From the viewpoint of a curl of a film, it is preferable that the film temperatures are the same on the front and back surfaces, but in a case where optical characteristics are controlled in the thickness direction, the stretching can be performed at different temperatures on the front and back surfaces. Furthermore, the stretching temperature herein is defined as a temperature on the lower side of the film surface. The machine-direction stretching step may be carried out in either one step or multiple steps. The preheating of the film is generally performed by passing it through a temperature-controlled heating roll, but in some cases, a heater can be used to heat the film. In addition, a ceramic roll or the like having improved adhesiveness can also be used in order to prevent the film from pressure-sensitive adhesion to the roll.

Cross-Direction Stretching

As the cross-direction stretching step, normal cross-direction stretching can be adopted. That is, examples of the normal cross-direction stretching include a stretching method in which both ends in the width direction of the film are gripped with clips, and the clips are widened while being heated in an oven using a tenter. With regard to the cross-direction stretching step, for example, methods described in JP1987-035817U (JP-S62-035817U), JP2001-138394A, JP1998-249934A (JP-H10-249934A), JP1994-270246A (JP-H06-270246A), JP1992-030922U (JP-H04-030922U), and JP1987-152721A (JP-S62-152721A) can be used, and these methods are herein incorporated by reference.

A stretching ratio (cross-direction stretching ratio) in the width direction of the film in the cross-direction stretching step is preferably 1.2 to 6 times, more preferably 1.5 to 5 times, and still more preferably 2 to 4 times. In addition, the cross-direction stretching ratio is preferably larger than the stretching ratio of the machine-direction stretching in a case where the machine-direction stretching is performed.

A stretching temperature in the cross-direction stretching step can be controlled by blowing air at a desired temperature into a tenter. The film temperatures may be the same or different on the front and back surfaces for the same reason as in the machine-direction stretching. The stretching temperature used herein is defined as a temperature on the lower side of the film surface. The cross-direction stretching step may be carried out in one step or in multiple steps. In addition, in a case of performing cross-direction stretching in multiple stages, the cross-direction stretching may be performed continuously or intermittently by providing a zone in which widening is not performed. For such the cross-direction stretching, in addition to the normal cross-direction stretching in which a clip is widened in the width direction in a tenter, a stretching method as below, in which a clip is widened by gripping, can also be applied.

Oblique-Direction Stretching

In the oblique-direction stretching step, the clips are widened in the cross-direction in the same manner as in the normal cross-direction stretching, but can be stretched in an oblique direction by switching the transportation speeds of the left and right clips. As the oblique-direction stretching step, for example, the methods described in JP2002-022944A, JP2002-086554A, JP2004-325561A, JP2008-23775A, and JP2008-110573A can be used.

Simultaneous Biaxial Stretching

In the simultaneous biaxial stretching, clips are widened in the cross-direction, and simultaneously stretched or contracted in the machine direction, in a similar manner to the normal cross-direction stretching. As the simultaneous biaxial stretching, for example, the methods described in JP1980-093520U (JP-555-093520U), JP1988-247021A (JP-563-247021A), JP1994-210726A (JP-H06-210726A), JP1994-278204A (JP-H06-278204A), JP2000-334832A, JP2004-106434A, JP2004-195712A, JP2006-142595A, JP2007-210306A, JP2005-022087A, and JP2006-517608A can be used.

Heat Treatment to Improve Bowing (Axis Misalignment)

Since the end part of the film is gripped by the clip in the cross-direction stretching step, the deformation of the film due to a thermal contraction stress generated during a heat treatment is large at the center of the film and is small at the end parts, and as a result, the characteristics in the width direction can be distributed. In a case where a straight line is drawn along the cross-direction on a surface of the film before the heat treatment step, the straight line on the surface of the film after the heat treatment step is an arcuate shape in which the center portion is recessed toward the downstream side. This phenomenon is called a bowing phenomenon, and is a cause that disturbs isotropy and widthwise uniformity of the film.

With an improvement method therefor, it is possible to reduce a variation in an alignment angle due to the bowing by performing preheating before the cross-direction stretching or by performing the thermal fixation after the stretching. The preheating and the thermal fixation may be performed, but it is preferable to perform the both. It is preferable to perform the preheating and the thermal fixation by gripping with a clip, that is, it is preferable to perform the preheating and the thermal fixation continuously with the stretching.

The preheating is performed at a temperature higher than the stretching temperature by preferably about 1° C. to 50° C., more preferably 2° C. to 40° C., and still more preferably 3° C. to 30° C. The preheating time is preferably 1 second to 10 minutes, more preferably 5 seconds to 4 minutes, and still more preferably 10 seconds to 2 minutes.

During the preheating, it is preferable to keep the width of the tenter almost constant. The term "almost" as mentioned herein refers to +10% of the width of the non-stretched film.

The thermal fixation is performed at a temperature lower than the stretching temperature by preferably about 1° C. to 50° C., more preferably 2° C. to 40° C., and still more preferably 3° C. to 30° C. Particularly preferably, the temperature is no higher than the stretching temperature and no higher than the Tg of the liquid crystal polymer.

The thermal fixation time is preferably 1 second to 10 minutes, more preferably 5 seconds to 4 minutes, and still more preferably 10 seconds to 2 minutes. During thermal fixation, it is preferable to keep the width of the tenter almost constant. The term "almost" as mentioned herein means 0% (the same width as the tenter width after stretching) to −30% (30% smaller than the tenter width after stretching=reduced width) of the tenter width after the completion of stretching. Examples of other known methods include the methods described in JP1989-165423A (JP-H01-165423A), JP1991-216326A (JP-H03-216326A), JP2002-018948A, and JP2002-137286A.

Thermal Relaxation Treatment

After the stretching step, a thermal relaxation treatment in which the film is heated to contract the film may be performed. By performing the thermal relaxation treatment, the thermal contraction rate at the time of using the film can be reduced. It is preferable that the thermal relaxation treatment is carried out at at least one timing of a time after film production, a time after machine-direction stretching, or a time after cross-direction stretching.

The thermal relaxation treatment may be continuously performed online after the stretching, or may be performed offline after winding after the stretching. Examples of the temperature of the thermal relaxation treatment include a temperature from a glass transition temperature Tg to a melting point Tm of the liquid crystal polymer. In a case where there is a concern about oxidative deterioration of the film, the thermal relaxation treatment may be performed in an inert gas such as a nitrogen gas, an argon gas, and a helium gas.

Post-Heating Treatment

From the viewpoint that the film according to the embodiment of the present invention can be easily produced, it is preferable that a non-stretched film produced by the method or a film which has been subjected to machine-direction stretching is subjected to cross-direction stretching and then subjected to a post-heating treatment.

In the post-heating treatment, it is preferable that a heat treatment is performed with or without fixing the film so as not to cause contraction of the film in the width direction by a fixing method such as gripping of both ends of the film in the width direction with a jig (clip). The film width after the post-heating treatment is preferably 85% to 105%, and more preferably 95% to 102% with respect to the film width before the post-heating treatment.

The heating temperature in the post-heating treatment is preferably {Tm−200}° C. or higher, more preferably {Tm−100}° C. or higher, still more preferably {Tm−50}° C. or higher, and particularly preferably {Tm}° C. or higher, with the melting point of the liquid crystal polymer being defined as Tm (° C.). Alternatively, the heating temperature in the post-heating treatment is preferably 240° C. or higher, more preferably 255° C. or higher, and still more preferably 270° C. or higher. The upper limit of the heating temperature in the post-heating treatment is preferably {Tm+70}° C. or lower, more preferably {Tm+50}° C. or lower, and still more preferably {Tm+30}° C. or lower.

In particular, in the post-heating treatment, the heating temperature of one surface of the polymer film is set to be equal to or higher than the melting point of the liquid crystal polymer (preferably {Tm}° C. to {Tm+30° C.}, and more preferably {Tm}° C. to {Tm+15}° C.), and it is preferable to carry out heating so that the heating temperature of one surface of the polymer film is higher than the heating temperature of the other surface side by 30° C. or more.

As a result, the aligning properties of the liquid crystal polymer near the surface layer (surface layer region) on one surface of the polymer film can be reduced, and therefore, a difference between the melting start temperature and the melting end temperature in the surface layer region of the polymer film, a difference between the area A2 and the area A1, and the like can be easily adjusted within the range.

Examples of a heating unit used for the post-heating treatment include a hot-air dryer, an infrared heater, a pressurized steam, microwave heating, and a heat medium circulation heating method. A treatment time of the post-heating treatment can be appropriately adjusted according to the type of the liquid crystal polymer, the heating unit, and the heating temperature. The treatment time is preferably 20 hours or less, more preferably 1 hour or less, and still more preferably 20 minutes or less.

Surface Treatment

Since the adhesiveness between the film and a metal-containing layer such as a copper foil and a copper plating layer can be further improved, it is preferable to subject the film to a surface treatment. Examples of the surface treatment include a glow discharge treatment, an ultraviolet irradiation treatment, a corona treatment, a flame treatment, and an acid or alkali treatment. The glow discharge treatment as mentioned herein may be a treatment with a low-temperature plasma generated in a gas at a low pressure ranging from $10^{-3}$ to 20 Torr, and is preferably a plasma treatment under atmospheric pressure.

The glow discharge treatment is performed using a plasma-excited gas. The plasma-excited gas refers to a gas that is plasma-excited under the above-described conditions, and examples thereof include argon, helium, neon, krypton, xenon, nitrogen, and carbon dioxide, fluorocarbons such as tetrafluoromethane, and mixtures of these.

It is also preferable to provide the film with an undercoat layer for adhesion to the metal-containing layer. This layer may be applied after the surface treatment or may be applied without the surface treatment.

The surface treatment and the undercoating step can be incorporated at the end of the film producing step, can be carried out alone, or can be carried out in a copper foil or a copper plating layer applying step.

It is also useful to subject the film to an aging treatment at a temperature which is temperature equal to or lower than the Tg of the liquid crystal polymer in order to improve the mechanical properties, the thermal dimensional stability, or the winding shape of the wound film.

In addition, with regard to the film, the smoothness of the film may be further improved by further performing a step of compressing the film with a heating roll and/or a step of stretching the film after performing the film producing step.

In the manufacturing method above, the case where the film is a monolayer is described, but the film may have a laminated structure in which a plurality of layers are laminated.

The polymer film is preferably used for the production of a laminate which will be described later by laminating the polymer film with a metal-containing layer. In addition, the polymer film can also be used as a film substrate.

Laminate

The laminate of an embodiment of the present invention has the polymer film and a metal-containing layer disposed on at least one surface side of the polymer film.

In the laminate, one metal-containing layer may be disposed on one surface side of the polymer film, or two metal-containing layers may be disposed on both sides of the polymer film.

The metal-containing layer is not particularly limited as long as it is a layer that is formed on a surface of a polymer film and includes a metal, and examples thereof include a metal layer covering the entire surface of the polymer film and a metal wiring line formed on the surface of the polymer film.

Examples of a material constituting the metal-containing layer include metals used for electrical connection. Examples of such metals include copper, gold, silver, nickel, aluminum, and alloys including any of these metals. Examples of the alloy include a copper-zinc alloy, a copper-nickel alloy, and a zinc-nickel alloy.

As a material constituting the metal-containing layer, copper is preferable from the viewpoint that the conductivity and the workability are excellent. As the metal-containing layer, a copper layer or a copper wiring line, which consists of copper or a copper alloy including 95% by mass or more of copper, is preferable. Examples of the copper layer include a rolled copper foil produced by a rolling method, and an electrolytic copper foil produced by an electrolysis method. The metal-containing layer may be subjected to a chemical treatment such as pickling.

As will be described later, the metal-containing layer is produced using, for example, a metal foil, and a wiring pattern is formed by a known processing method, as necessary.

A thickness of the metal-containing layer is not particularly limited, and is appropriately selected depending on a use of a circuit board, but the thickness is preferably 4 to 100 µm, and more preferably 10 to 35 µm from the viewpoints of wiring line conductivity and economical efficiency.

A maximum height Rz on a surface of the metal-containing layer constituting the laminate, on the side facing the polymer film, is preferably 5 µm or less, more preferably 4 µm or less, and still more preferably 3 µm or less from the viewpoint that a transmission loss of the laminate in a case of being used as a communication circuit board can be reduced. The lower limit is not particularly limited, but is preferably 0.1 µm or more.

The maximum height Rz on a surface of the metal-containing layer is determined by measuring a maximum height Rz at any 10 points and arithmetically averaging the obtained measured values, using a stylus type roughness meter according to JIS B0601, on a surface of the metal-containing layer peeled from the laminate, on the side facing the polymer film.

In a case where a commercially available metal foil is used as the metal-containing layer, a value of the maximum height Rz described as a catalog value of the commercially available product may be used.

The peel strength between the polymer film and the metal-containing layer in the laminate is preferably 6.5 N/cm or more, more preferably 6.8 N/cm or more, and still more preferably 7.0 N/cm or more. The more the peel strength, the more excellent the adhesiveness between the polymer film and the metal-containing layer.

The upper limit of the peel strength of the laminate is not particularly limited, and may be 7.5 N/cm or less.

A method for measuring the peel strength of the laminate will be described in the section of Examples which will be described later.

The laminate may have a layer other than the polymer film and the metal-containing layer, as necessary. Examples of such another layer include an adhesive layer which will be described later, a rust preventive layer, and a heat resistant layer.

A method for producing the laminate is not particularly limited, and a laminate having a polymer film, and for example, a polymer film and a metal foil consisting of the metal can be laminated, and then compression-bonded under high temperature conditions to produce a laminate having the polymer film and a metal-containing layer. Furthermore, in a case where a metal foil having a maximum surface height Rz within the preferred range is used, the polymer film and the metal foil are bonded to each other so that a surface of the metal foil is in contact with the polymer film.

The method and the conditions for the compression-bonding treatment are not particularly limited, and are appropriately selected from known methods and conditions.

The temperature condition for the compression-bonding treatment is preferably 90° C. to 310° C., and the pressure condition for the compression-bonding treatment is preferably 1 to 100 MPa.

In the laminate, the polymer film and the metal-containing layer may be laminated via the adhesive layer in order to improve the adhesiveness. That is, the laminate may have an adhesive layer between the polymer film and the metal-containing layer.

The adhesive layer is not particularly limited as long as it is a known adhesive layer used for manufacturing a wiring board such as a copper-clad laminate, and examples thereof include a cured product of an adhesive composition including a known curable resin such as a polyimide and an epoxy resin.

The laminate having an adhesive layer can be produced by, for example, applying an adhesive composition to at least one surface of a polymer film or at least one surface of a metal foil, subjecting the coating film to drying and/or curing as necessary to form an adhesive layer, and then laminating the polymer film and the metal foil via the adhesive layer according to the method.

Examples of a use of the laminate and the polymer film include a laminated circuit board, a flexible laminated board, and a wiring board such as a flexible printed wiring board (FPC). The laminate and the polymer film are particularly preferably used as a substrate for high-speed communication.

EXAMPLES

Hereinafter, the present invention will be described in more detail with reference to Examples. The materials, the amounts of materials used, the ratios, the treatment details, the treatment procedure, or the like shown in the following Examples can be appropriately modified without departing from the spirit of the present invention. Therefore, the scope of the present invention should not be restrictively interpreted by the following Examples. Furthermore, the terms "part" and "%" are based on mass unless otherwise specified.

Raw Materials

Liquid Crystal Polymer

Liquid crystal polymer (LCP1): A polymer synthesized based on Example 1 of JP2019-116586A (melting point Tm: 320° C., dielectric loss tangent: 0.0007).

Liquid crystal polymer (LCP2): LAPEROS C-950 manufactured by Polyplastics Co., Ltd. (melting point Tm: 310° C., dielectric loss tangent: 0.0017)

LCP1 is composed of a repeating unit derived from 6-hydroxy-2-naphthoic acid, a repeating unit derived from 4,4'-dihydroxybiphenyl, a repeating unit derived from terephthalic acid, and a repeating unit derived from 2,6-naphthalenedicarboxylic acid.

LCP2 is a polymer represented by the following chemical formula.

In addition, the dielectric loss tangent of each liquid crystal polymer was measured by a cavity resonator perturbation method using a cavity resonator (CP-531 manufactured by Kanto Electronics Application & Development, Inc.) according to the above-mentioned method.

Compatible Components

Compound 1: BONDFIRST (registered trademark) E manufactured by Sumitomo Chemical Co., Ltd. (copolymer of ethylene and glycidyl methacrylate (E-GMA copolymer))

Heat Stabilizer

Heat Stabilizer 1: Irganox 1010 (hindered phenol-based heat stabilizer) manufactured by BASF Polyolefin PE: NOVATEC LD (low-density polyethylene) manufactured by Japan Polyethylene Corporation

Example 1

Production of Polymer Film

Supply Step

Components (a liquid crystal polymer, a polyolefin, a compatible component, and a heat stabilizer) shown in the table described in the latter part were mixed in a formulation as shown in the table, and kneaded and pelletized using an extruder. The kneaded and pelletized resin was dried at 80° C. using a dehumidifying hot-air dryer having a dew point temperature of −45° C. for 12 hours to reduce the water content to 50 ppm or less. The pellets dried in this manner are also referred to as a raw material A.

Film Producing Step

The dried raw material A was supplied into a cylinder from the same supply port of a twin-screw extruder having a screw diameter of 50 mm, heated, and kneaded at 270° C. to 350° C., and a melted film-like liquid crystal polymer was discharged from a die having a die width of 750 mm and a slit spacing of 300 μm. The uneven thickness of the discharged film-like liquid crystal polymer in the width direction was improved by finely adjusting a clearance of the die lip portion. In this manner, a film having a thickness of 50 μm was obtained.

Cross-Direction Stretching Step

The film manufactured in the film producing step was stretched in the TD direction using a tenter. The stretching ratio at this time was 3.2 times.

Post-Heating Treatment

The obtained film was specifically heated using a heater so that a temperature difference between one surface and the other surface of the post-heating treated film was 30° C. or more, and one surface (higher temperature) was adjusted to exceed the melting point (Tm) of the liquid crystal polymer.

In the post-heating treatment, a film for measuring the film surface temperature was placed in the vicinity of the film to be subjected to a heating treatment, and front and back film surface temperatures of the film were measured using a thermocouple attached to the surface of the film for measuring the film surface temperature with a tape made of a polyimide material.

In this manner, the polymer film 1 in Example 1 was produced.

Production of Laminate

Formation of Adhesive Layer 17.7 g of a polyimide resin solution ("PIAD-200" manufactured by Arakawa Chemical Industries, Ltd.), 0.27 g of N,N-diglycidyl-4-glycidyloxyaniline, and 1.97 g of toluene were mixed and stirred to obtain an adhesive varnish having a concentration of solid contents of 28% by mass.

The obtained adhesive varnish was applied to one surface of the film 1 using an applicator. The coating film was dried at 85° C. for 1 hour to provide an adhesive layer having a film thickness of 0.8 and a film 1 with an adhesive layer was manufactured.

Formation of Laminate with Copper Layer

The obtained film 1 with an adhesive layer and a non-roughening-treated copper foil ("CF-T9DA-SV-18" manufactured by Fukuda Metal Foil & Powder Co., Ltd., a thickness of 18 μm) were laminated so that the adhesive layer of the film 1 with an adhesive layer and the non-roughening-treated surface (maximum height Rz of 0.85 μm) of the non-roughening-treated copper foil were in contact with each other, and then compression-bonded for 1 hour under the conditions of 200° C. and 4 MPa using a hot press machine (Toyo Seiki Seisaku-sho, Ltd.) to obtain a laminate 1 in which the film 1, the adhesive layer, and the copper foil were laminated in this order.

Examples 2 to 8

The polymer films and the laminates of Examples 2 to 8 were manufactured in the same manner as in Example 1, except that the conditions for the post-heating treatment (at least one of the time or the heating temperature) were appropriately changed.

Furthermore, in each of Examples 2 to 8, the temperature difference between one surface and the other surface of the film was 30° C. or more in the post-heating treatment.

Example 9

The polymer film and the laminate of Example 9 were manufactured in the same manner as in Example 1, except that the type of the liquid crystal polymer used in the supply step was changed.

Example 10

The polymer film and the laminate of Example 10 were manufactured in the same manner as in Example 1, except that the type of the liquid crystal polymer used in the supply step and the conditions for the post-heating treatment (at least one of the time or the heating temperature) were appropriately changed.

Furthermore, in Example 10, the temperature difference between one surface and the other surface of the film was 30° C. or more in the post-heating treatment.

Example 11

The polymer film and the laminate of Example 11 were manufactured in the same manner as in Example 1, except that the conditions for the post-heating treatment (at least one of the time or the heating temperature) were appropriately changed.

Furthermore, in Example 11, the temperature difference between one surface and the other surface of the film was 30° C. or more in the post-heating treatment.

Examples 12 to 14

The polymer films and the laminates of Examples 12 to 14 were manufactured in the same manner as in Example 1, except that the film producing speed was appropriately adjusted so that a thickness of the polymer film was as shown in Table 1.

Examples 15 to 18

The polymer films and the laminates of Examples 15 to 18 were manufactured in the same manner as in Example 1, except that the conditions for the cross-direction stretching step were appropriately changed.

Examples 19 to 22

The polymer films and the laminates of Examples 19 to 22 were manufactured in the same manner as in Example 1, except that the concentration of the polyolefin used in the supply step was changed as shown in Table 1.

Examples 23 and 24

The polymer films and the laminates of Examples 23 and 24 were manufactured in the same manner as in Example 1, except that the extrusion conditions in the film producing step were appropriately changed.

Comparative Example 1

The polymer film and the laminate of Comparative Example 1 were manufactured in the same manner as in Example 1, except that the conditions for the post-heating treatment were changed.

Furthermore, in Comparative Example 1, the temperature difference between one surface and the other surface of the film ((one surface)–(the other surface)) was 0° C. or more and less than 30° C. in the post-heating treatment.

Comparative Example 2

The polymer film and the laminate of Comparative Example 2 were manufactured in the same manner as in Example 1, except that the type of the liquid crystal polymer used in the supply step was changed as shown in Table 1 and the conditions for the post-heating treatment were changed.

Furthermore, in Comparative Example 2, the temperature difference between one surface and the other surface of the film ((one surface)–(the other surface)) was 0° C. or more and less than 30° C. in the post-heating treatment.

Comparative Example 3

The polymer film and the laminate of Comparative Example 3 were manufactured in the same manner as in Example 1, except that the conditions for the post-heating treatment were changed without using a polyolefin in the supply step.

Furthermore, in Comparative Example 3, the temperature difference between one surface and the other surface of the film ((one surface)–(the other surface)) was 0° C. or more and less than 30° C. in the post-heating treatment.

Comparative Example 4

The polymer film and the laminate of Comparative Example 4 were prepared in the same manner as in Example 1, except that the type of the liquid crystal polymer used in the feeding step was changed as shown in Table 1, the polyolefin was not used in the supply step, and the conditions for the post-heating treatment were changed.

Furthermore, in Comparative Example 4, the temperature difference between one surface and the other surface of the film ((one surface)–(the other surface)) was 0° C. or more and less than 30° C. in the post-heating treatment.

Comparative Example 5

The polymer film and the laminate of Comparative Example 1 were manufactured in the same manner as in Example 1, except that the conditions for the post-heating treatment were changed.

Furthermore, in Comparative Example 5, the temperature difference between one surface and the other surface of the film ((one surface)–(the other surface)) was 0° C. or more and less than 30° C. in the post-heating treatment.

Measurement and Evaluation

The following measurement and evaluation were performed on each of the polymer films and the laminates obtained by the method.

Average Disperse Diameter

The disperse phase of the polyolefin in each of the polymer films of Examples and Comparative Examples was observed using a scanning electron microscope (SEM), and an average disperse diameter thereof was determined by the following method.

At 10 different sites on the sample, a fractured surface parallel to a width direction of the polymer film and perpendicular to the polymer film surface and a fractured surface perpendicular to the width direction of the polymer film and perpendicular to the polymer film surface were observed to obtain a total of 20 observation images. The observation was carried out at an appropriate magnification of 100 to 100,000 times, and images were taken so that the disperse state of the particles (disperse phase formed by the polyolefin) in the width of the entire thickness of the polymer film could be confirmed.

For 200 particles randomly selected from each of the 20 images, the outer circumference of each particle was traced, and the equivalent circle diameter of the particles was measured from these trace images with an image analyzer to determine the particle diameter. An average value of the particle diameters measured from each image taken was defined as the average disperse diameter of the disperse phase.

Differential Scanning Calorimetry

For each of polymer films of Examples and Comparative Examples, a temperature was raised to 400° C. at 10° C./min based on JIS K7122:2012 (heat flux differential scanning calorimetry), using a differential scanning calorimeter (DSC-60A, manufactured by Shimadzu Corporation), and a DSC curve was measured.

For the analysis of the DSC curve, a melting peak temperature existing at 200° C. to 400° C., a difference between the melting start temperature and the melting end temperature, and an area of the melting peak (the area A1 and the area A2 described above) were determined using bundled analysis software (TA-60, manufactured by Shimadzu Corporation).

Here, the measurement was performed on both the extracted region (surface layer region) from one surface to a depth of 10 μm of the polymer film, and the entire polymer film.

Furthermore, in the present Example, as a method for extracting the surface layer region, a method in which polishing is performed from one surface side of the polymer film using abrasive paper, leaving a thickness of 10 μm of the polymer film on the other surface side, was performed. It should be noted that as the method for extracting the surface layer region, for example, a method in which a slurry having a mixture of water and an abrasive is sprayed from one surface side of the polymer film at a high pressure for polishing, leaving 10 μm of the polymer film on the other surface side, may be performed.

Dielectric Loss Tangent

Using a sample cut out so as to include an entire thickness direction of each of the polymer films produced in Examples and Comparative Examples, the dielectric loss tangent in a frequency band of 28 GHz was measured in an environment at a temperature of 23° C. and a humidity of 65% RH, using a split cylinder type resonator ("CR-728" manufactured by Kanto Electronics Application & Development, Inc.) and a network analyzer (Keysight N5230A).

Linear Expansion Coefficient

The linear expansion coefficient in the in-plane direction of each of the polymer films of Examples and Comparative Examples was measured using a thermomechanical analyzer (Thermal Mechanical Analysis (TMA), manufactured by Shimadzu Corporation) according to JIS K7197. More specifically, a sample having a width of 5 mm and a length of 14 mm was cut from the center portion of the polymer film, and taken out. Furthermore, the center portion of the polymer film was measured at 5 points in each of the MD direction and the TD direction, and an arithmetic mean value for each measurement direction was determined.

Peeling Strength

Each of the laminates of Examples and Comparative Examples was cut into strips in 1 cm×5 cm to manufacture a sample. A peel strength (unit: kN/m) of the obtained sample was measured according to the method for measuring a peel strength under normal conditions described in JIS C 6481. The peeling of the copper foil from the sample in a peel strength test was performed at an angle of 90° with respect to the sample and a peeling rate of 50 mm/sec. Furthermore, the measurement was performed at each of 5 points, and an arithmetic mean value thereof was determined. The evaluation standard is as follows.

Evaluation Standard

A: 7.0 N/cm or more
B: 6.8 N/cm or more and less than 7.0 N/cm
C: 6.5 N/cm or more and less than 6.8 N/cm
D: Less than 6.5 N/cm

TABLE 1

Composition of polymer film

| Table 1-1 | Liquid crystal polymer Type | Liquid crystal polymer Content % by mass | Polyolefin Type | Polyolefin Content % by mass | Polyolefin Average disperse diameter μm | Compatible component Type | Compatible component Content % by mass | Heat stabilizer Type | Heat stabilizer Content % by mass |
|---|---|---|---|---|---|---|---|---|---|
| Example 1 | LCP1 | 84.9 | PE | 12.0 | 1.5 | Compound 1 | 3.0 | Heat stabilizer 1 | 0.1 |
| Example 2 | LCP1 | 84.9 | PE | 12.0 | 1.4 | Compound 1 | 3.0 | Heat stabilizer 1 | 0.1 |
| Example 3 | LCP1 | 84.9 | PE | 12.0 | 1.6 | Compound 1 | 3.0 | Heat stabilizer 1 | 0.1 |
| Example 4 | LCP1 | 84.9 | PE | 12.0 | 1.5 | Compound 1 | 3.0 | Heat stabilizer 1 | 0.1 |
| Example 5 | LCP1 | 84.9 | PE | 12.0 | 1.4 | Compound 1 | 3.0 | Heat stabilizer 1 | 0.1 |
| Example 6 | LCP1 | 84.9 | PE | 12.0 | 1.5 | Compound 1 | 3.0 | Heat stabilizer 1 | 0.1 |
| Example 7 | LCP1 | 84.9 | PE | 12.0 | 1.4 | Compound 1 | 3.0 | Heat stabilizer 1 | 0.1 |
| Example 8 | LCP1 | 84.9 | PE | 12.0 | 1.3 | Compound 1 | 3.0 | Heat stabilizer 1 | 0.1 |
| Example 9 | LCP2 | 84.9 | PE | 12.0 | 1.2 | Compound 1 | 3.0 | Heat stabilizer 1 | 0.1 |
| Example 10 | LCP2 | 84.9 | PE | 12.0 | 1.6 | Compound 1 | 3.0 | Heat stabilizer 1 | 0.1 |
| Example 11 | LCP1 | 84.9 | PE | 12.0 | 1.4 | Compound 1 | 3.0 | Heat stabilizer 1 | 0.1 |
| Example 12 | LCP1 | 84.9 | PE | 12.0 | 1.5 | Compound 1 | 3.0 | Heat stabilizer 1 | 0.1 |
| Example 13 | LCP1 | 84.9 | PE | 12.0 | 1.4 | Compound 1 | 3.0 | Heat stabilizer 1 | 0.1 |
| Example 14 | LCP1 | 84.9 | PE | 12.0 | 1.5 | Compound 1 | 3.0 | Heat stabilizer 1 | 0.1 |
| Example 15 | LCP1 | 84.9 | PE | 12.0 | 1.3 | Compound 1 | 3.0 | Heat stabilizer 1 | 0.1 |
| Example 16 | LCP1 | 84.9 | PE | 12.0 | 1.5 | Compound 1 | 3.0 | Heat stabilizer 1 | 0.1 |
| Example 17 | LCP1 | 84.9 | PE | 12.0 | 1.4 | Compound 1 | 3.0 | Heat stabilizer 1 | 0.1 |
| Example 18 | LCP1 | 84.9 | PE | 12.0 | 1.4 | Compound 1 | 3.0 | Heat stabilizer 1 | 0.1 |
| Example 19 | LCP1 | 94.9 | PE | 4.0 | 1.0 | Compound 1 | 1.0 | Heat stabilizer 1 | 0.1 |
| Example 20 | LCP1 | 89.9 | PE | 8.0 | 1.1 | Compound 1 | 2.0 | Heat stabilizer 1 | 0.1 |
| Example 21 | LCP1 | 64.9 | PE | 29.0 | 3.1 | Compound 1 | 6.0 | Heat stabilizer 1 | 0.1 |
| Example 22 | LCP1 | 99.9 | — | 0.0 | — | — | 0.0 | Heat stabilizer 1 | 0.1 |
| Example 23 | LCP1 | 84.9 | PE | 12.0 | 9.8 | Compound 1 | 3.0 | Heat stabilizer 1 | 0.1 |
| Example 24 | LCP1 | 84.9 | PE | 12.0 | 10.3 | Compound 1 | 3.0 | Heat stabilizer 1 | 0.1 |
| Comparative Example 1 | LCP1 | 84.9 | PE | 12.0 | 1.2 | Compound 1 | 3.0 | Heat stabilizer 1 | 0.1 |
| Comparative Example 2 | LCP2 | 84.9 | PE | 12.0 | 1.4 | Compound 1 | 3.0 | Heat stabilizer 1 | 0.1 |
| Comparative Example 3 | LCP1 | 99.9 | — | 0.0 | — | — | 0.0 | Heat stabilizer 1 | 0.1 |
| Comparative Example 4 | LCP2 | 99.9 | — | 0.0 | — | — | 0.0 | Heat stabilizer 1 | 0.1 |
| Comparative Example 5 | LCP1 | 84.9 | PE | 12.0 | 1.3 | Compound 1 | 3.0 | Heat stabilizer 1 | 0.1 |

TABLE 2

| Table 1-2 | Differential scanning calorimetry Surface layer region Difference between melting start temperature and melting end temperature °C. | Differential scanning calorimetry Surface layer region Area A1 J/g | Differential scanning calorimetry Surface layer region Melting peak temperature °C. | Differential scanning calorimetry Entire polymer film Area A2 J/g | Physical properties Dielectric loss tangent | Physical properties Linear expansion coefficient MD direction ppm/°C. | Physical properties Linear expansion coefficient TD direction ppm/°C. | Thickness of polymer film μm | Evaluation results Peeling strength N/cm | Evaluation results Measurement |
|---|---|---|---|---|---|---|---|---|---|---|
| Example 1 | 30 | 2.8 | 320 | 4.9 | 0.0013 | 24 | 30 | 50 | 7.1 | A |
| Example 2 | 6.0 | 1.5 | 318 | 3.2 | 0.0015 | 28 | 29 | 50 | 7.4 | A |
| Example 3 | 49 | 5.2 | 323 | 7.8 | 0.0012 | 21 | 28 | 50 | 6.8 | B |
| Example 4 | 50 | 5.4 | 321 | 5.4 | 0.0012 | 20 | 22 | 50 | 6.9 | B |
| Example 5 | 50 | 12.7 | 321 | 13.1 | 0.0011 | 19 | 21 | 50 | 6.6 | C |
| Example 6 | 31 | 2.9 | 328 | 22.7 | 0.0007 | 11 | 12 | 50 | 7.1 | A |
| Example 7 | 29 | 3.2 | 329 | 24.8 | 0.0009 | 15 | 14 | 50 | 7.1 | A |
| Example 8 | 45 | 1.8 | 320 | 2.8 | 0.0017 | 40 | 42 | 50 | 6.9 | B |
| Example 9 | 45 | 3.3 | 290 | 5.3 | 0.0027 | 25 | 29 | 50 | 7.2 | A |
| Example 10 | 43 | 3.1 | 286 | 5.1 | 0.0049 | 25 | 29 | 50 | 7.2 | A |
| Example 11 | 9.0 | 16.6 | 341 | 16.7 | 0.001 | 5 | 6 | 50 | 6.7 | C |
| Example 12 | 35 | 4.7 | 321 | 8.6 | 0.0015 | 31 | 34 | 25 | 7.0 | A |
| Example 13 | 29 | 4.1 | 319 | 6.4 | 0.0013 | 21 | 28 | 100 | 7.2 | A |
| Example 14 | 28 | 3.2 | 320 | 5.5 | 0.0013 | 20 | 26 | 200 | 7.2 | A |
| Example 15 | 29 | 3.3 | 320 | 5.6 | 0.0013 | 5 | 48 | 50 | 6.9 | B |
| Example 16 | 30 | 4.1 | 321 | 5.3 | 0.0013 | 1 | 52 | 50 | 6.7 | C |
| Example 17 | 31 | 3.4 | 321 | 4.9 | 0.0013 | 47 | 6 | 50 | 7.0 | A |
| Example 18 | 30 | 2.6 | 320 | 4.5 | 0.0013 | 51 | 4 | 50 | 6.6 | C |
| Example 19 | 27 | 3.2 | 323 | 6.6 | 0.0011 | 20 | 22 | 50 | 7.0 | A |

TABLE 2-continued

| | Differential scanning calorimetry | | | Entire | Physical properties | | | | Evaluation results | |
| | Surface layer region | | | polymer film | | Linear expansion coefficient | | Thickness | | |
| Table 1-2 | Difference between melting start temperature and melting end temperature ° C. | Area A1 J/g | Melting peak temperature ° C. | Area A2 J/g | Dielectric loss tangent — | MD direction ppm/° C. | TD direction ppm/° C. | of polymer film μm | Peeling strength N/cm | Measurement — |
|---|---|---|---|---|---|---|---|---|---|---|
| Example 20 | 28 | 3.3 | 322 | 7.1 | 0.0012 | 23 | 29 | 50 | 7.0 | A |
| Example 21 | 34 | 3.8 | 317 | 5.4 | 0.0015 | 32 | 35 | 50 | 7.4 | A |
| Example 22 | 30 | 4.4 | 325 | 7.3 | 0.0011 | 19 | 18 | 50 | 6.9 | B |
| Example 23 | 30 | 2.5 | 320 | 5.2 | 0.0013 | 26 | 29 | 50 | 6.9 | B |
| Example 24 | 29 | 2.7 | 320 | 6.4 | 0.0013 | 25 | 29 | 50 | 6.7 | C |
| Comparative Example 1 | 51 | 12.6 | 320 | 12.8 | 0.0013 | 25 | 32 | 50 | 6.4 | D |
| Comparative Example 2 | 52 | 1.8 | 290 | 1.9 | 0.0026 | 23 | 30 | 50 | 6.4 | D |
| Comparative Example 3 | 54 | 14.7 | 324 | 15.3 | 0.0011 | 20 | 17 | 50 | 6.1 | D |
| Comparative Example 4 | 53 | 2.1 | 290 | 2.3 | 0.002 | 19 | 19 | 50 | 6.2 | D |
| Comparative Example 5 | 4.9 | 18.9 | 347 | 18.9 | 0.0008 | 2 | 1 | 50 | 5.1 | D |

From the results shown in the tables, it was confirmed that the objects of the present invention can be accomplished with the liquid crystal polymer film of the embodiment of the present invention.

EXPLANATION OF REFERENCES

A1, A2: area
S1, S2, E1, E2: point
$T_{P1}$: melting peak temperature
$T_{S1}$, $T_{S2}$: melting start temperature
$T_{E1}$, $T_{E2}$: melting end temperature

What is claimed is:

1. A polymer film comprising a liquid crystal polymer, wherein a difference between a melting start temperature and a melting end temperature in differential scanning calorimetry in a depth region up to 10 μm of the polymer film from one surface toward the other surface of the polymer film is 5.0° C. to 50° C.,
wherein an area A1 of a melting peak in differential scanning calorimetry in the depth region from one surface up to 10 μm of the polymer film is smaller than an area A2 of a melting peak in differential scanning calorimetry of the entire polymer film,
wherein a thickness of the polymer film is more than 20 μm.

2. The polymer film according to claim 1, wherein the area A1 is 1.0 to 12.0 J/g and the area A2 is 3.0 J/g or more.

3. The polymer film according to claim 1, wherein a melting peak temperature in differential scanning calorimetry in the depth region from one surface up to 10 μm of the polymer film is 290° C. to 340° C.

4. The polymer film according to claim 1, wherein a thickness of the polymer film is 250 μm or less.

5. The polymer film according to claim 1, wherein a linear expansion coefficient in a first direction in a plane of the polymer film and a linear expansion coefficient in a second direction orthogonal to the first direction in the plane of the polymer film are both 0 to 40 ppm/° C.

6. The polymer film according to claim 1, wherein the liquid crystal polymer includes a repeating unit derived from 6-hydroxy-2-naphthoic acid.

7. The polymer film according to claim 1, wherein the liquid crystal polymer includes at least one selected from the group consisting of a repeating unit derived from 6-hydroxy-2-naphthoic acid, a repeating unit derived from an aromatic diol compound, a repeating unit derived from terephthalic acid, and a repeating unit derived from 2,6-naphthalenedicarboxylic acid.

8. The polymer film according to claim 1, further comprising a polyolefin.

9. The polymer film according to claim 8, wherein a content of the polyolefin is 0.1% to 40% by mass with respect to a total mass of the polymer film.

10. The polymer film according to claim 8, wherein the polyolefin forms a disperse phase in the polymer film and an average disperse diameter of the disperse phase is 0.01 to 10.0 μm.

11. A laminate comprising:
the polymer film according to claim 1; and
a metal-containing layer disposed on at least one surface side of the polymer film.

12. A substrate for high-speed communication, comprising the polymer film according to claim 1.

13. The polymer film according to claim 1, wherein a melting peak temperature in differential scanning calorimetry in the depth region from one surface up to 10 μm of the polymer film is 290° C. to 340° C.

14. The polymer film according to claim 2, wherein a melting peak temperature in differential scanning calorimetry in the depth region from one surface up to 10 μm of the polymer film is 290° C. to 340° C.

15. The polymer film according to claim 2, wherein a thickness of the polymer film is 250 μm or less.

16. The polymer film according to claim 3, wherein a thickness of the polymer film is 250 μm or less.

17. The polymer film according to claim 2, wherein a linear expansion coefficient in a first direction in a plane of the polymer film and a linear expansion coefficient in a second direction orthogonal to the first direction in the plane of the polymer film are both 0 to 40 ppm/° C.

* * * * *